US012796208B2

(12) United States Patent
Wang

(10) Patent No.: US 12,796,208 B2
(45) Date of Patent: Nov. 10, 2026

(54) LIGHT-EMITTING DEVICE AND MANUFACTURING METHOD THEREOF, AND DISPLAY SUBSTRATE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Haowei Wang, Beijing (CN)

(73) Assignee: BEIJING BOE TECHNOLOGY DEVELOPMENT CO. , LTD., Beijing (CN)

( * ) Notice: Subject to any disclaimer, the term of this patent is extended or adjusted under 35 U.S.C. 154(b) by 812 days.

(21) Appl. No.: 18/044,181

(22) PCT Filed: Mar. 24, 2022

(86) PCT No.: PCT/CN2022/082860

§ 371 (c)(1),
(2) Date: Mar. 6, 2023

(87) PCT Pub. No.: WO2023/178620

PCT Pub. Date: Sep. 28, 2023

(65) Prior Publication Data

US 2024/0196638 A1 Jun. 13, 2024

(51) Int. Cl.

*H10K 50/115* (2023.01)
*H10K 50/13* (2023.01)
(Continued)

(52) U.S. Cl.

CPC ........... *H10K 50/115* (2023.02); *H10K 50/13* (2023.02); *H10K 50/155* (2023.02);
(Continued)

(58) Field of Classification Search

CPC .... H10K 50/115; H10K 50/13; H10K 50/155; H10K 50/157; H10K 50/865; H10K 71/12; H10K 71/30; H10K 2102/351
See application file for complete search history.

(56) References Cited

U.S. PATENT DOCUMENTS 4,570,172 A * 2/1986 Henry .................. H10H 20/813 257/97
10,367,162 B1 7/2019 Boardman et al.
(Continued)

FOREIGN PATENT DOCUMENTS

CN 104282839 A 1/2015
CN 106384786 A 2/2017
(Continued)

*Primary Examiner* — Gerard Higgins
(74) *Attorney, Agent, or Firm* — XSENSUS LLP

(57) ABSTRACT

A light-emitting device includes a first electrode and a second electrode arranged opposite to each other, and a light-emitting functional layer located between the first electrode and the second electrode. The light-emitting functional layer includes a first light-emitting layer, and the first light-emitting layer includes a first light-emitting material. The first light-emitting material is configured to emit light in response to a control of an electrical signal on the first electrode and an electrical signal on the second electrode. The light-emitting functional layer further includes a second light-emitting material. A difference between a Stokes shift of the first light-emitting material and a Stokes shift of the second light-emitting material is in a range of 10 nm to 50 nm, inclusive.

20 Claims, 19 Drawing Sheets

(51) Int. Cl.

| | |
|---|---|
| ***H10K 50/15*** | (2023.01) |
| ***H10K 50/155*** | (2023.01) |
| ***H10K 50/86*** | (2023.01) |
| ***H10K 71/12*** | (2023.01) |
| ***H10K 71/30*** | (2023.01) |
| *H10K 102/00* | (2023.01) |

(52) U.S. Cl.
CPC ......... *H10K 50/157* (2023.02); *H10K 50/865* (2023.02); *H10K 71/12* (2023.02); *H10K 71/30* (2023.02); *H10K 2102/351* (2023.02)

(56) References Cited

U.S. PATENT DOCUMENTS

| | | | |
|---|---|---|---|
| 2016/0118610 | A1 | 4/2016 | Wang et al. |
| 2018/0151814 | A1 | 5/2018 | Hirose et al. |
| 2020/0048199 | A1 | 2/2020 | Baek et al. |
| 2023/0171977 | A1 | 6/2023 | Tasaki et al. |

FOREIGN PATENT DOCUMENTS

| | | | |
|---|---|---|---|
| CN | 110323344 | B | 7/2021 |
| WO | 2021210582 | A1 | 10/2021 |

* cited by examiner

LIGHT-EMITTING DEVICE AND MANUFACTURING METHOD THEREOF, AND DISPLAY SUBSTRATE

CROSS-REFERENCE TO RELATED APPLICATION

This application is a national phase entry under 35 USC 371 of International Patent Application No. PCT/CN 2022/082860 filed on Mar. 24, 2022, which is incorporated herein by reference in its entirety.

TECHNICAL FIELD

The present disclosure relates to the field of display technologies, and in particular, to a light-emitting device and a manufacturing method thereof, and a display substrate.

BACKGROUND

Quantum dots are an important fluorescent nanomaterial with excellent physicochemical and optical properties, such as wide absorption spectrum, narrow emission spectrum, high quantum yield and good fluorescence stability. The quantum dots are widely used in the fields of bioimaging, biosensors, light-emitting diodes (LEDs) and quantum dot solar cells.

SUMMARY

In an aspect, a light-emitting device is provided. The light-emitting device includes a first electrode and a second electrode arranged opposite to each other, and a light-emitting functional layer located between the first electrode and the second electrode. The light-emitting functional layer includes a first light-emitting layer, and the first light-emitting layer includes a first light-emitting material. The first light-emitting material is configured to emit light in response to a control of an electrical signal on the first electrode and an electrical signal on the second electrode. The light-emitting functional layer further includes a second light-emitting material. A difference between a Stokes shift of the first light-emitting material and a Stokes shift of the second light-emitting material is in a range of 10 nm to 50 nm, inclusive.

In some embodiments, the second light-emitting material is configured to absorb light that does not exit from the light-emitting device in first light emitted from the first light-emitting material, and to emit second light. A peak position of the first light emitted from the first light-emitting material is a first peak position, and a peak position of the second light emitted from the second light-emitting material is a second peak position. A difference between a peak wavelength at the first peak position and a peak wavelength at the second peak position is in a range of 0 nm to 10 nm, inclusive.

In some embodiments, a mass ratio of the second light-emitting material to the first light-emitting material is in a range of 0.1% to 10%, inclusive.

In some embodiments, the light-emitting functional layer further includes a first carrier transport layer located between the first light-emitting layer and the first electrode, and a second carrier transport layer located between the first light-emitting layer and the second electrode. The second light-emitting material is located between the first carrier transport layer and the first electrode, and/or the second light-emitting material is located between the second carrier transport layer and the second electrode. A film layer in which the second light-emitting material is disposed is a second light-emitting layer.

In some embodiments, the first carrier transport layer includes at least one of a hole injection layer, a hole transport layer and an electron blocking layer. The second carrier transport layer includes at least one of an electron injection layer, an electron transport layer and a hole blocking layer.

In some embodiments, the second light-emitting layer is a discontinuous film layer.

In some embodiments, a film thickness of the second light-emitting layer is in a range of 5 nm to 20 nm, inclusive.

In some embodiments, the light-emitting functional layer further includes at least one first carrier transport layer located between the first light-emitting layer and the first electrode and doped with the second light-emitting material. A first carrier transport layer doped with the second light-emitting material in the at least one first carrier transport layer is a second light-emitting layer.

In some embodiments, the at least one first carrier transport layer includes a hole injection layer, and the second light-emitting material is located in the hole injection layer.

In some embodiments, a doping concentration of the second light-emitting material in the at least one first carrier transport layer is in a range of 1% to 10%, inclusive.

In some embodiments, the at least one first carrier transport layer further includes at least one of a hole transport layer and an electron blocking layer. The light-emitting functional layer further includes at least one second carrier transport layer located between the first light-emitting layer and the second electrode. The at least one second carrier transport layer includes at least one of an electron injection layer, an electron transport layer and a hole blocking layer.

In some embodiments, the second light-emitting material is a perovskite quantum dot material.

In some embodiments, a particle size of the perovskite quantum dot material is in a range of 10 nm to 110 nm, inclusive.

In some embodiments, a chemical formula of the perovskite quantum dot material is $CsPbX_3$, and X represents one of halogens.

In some embodiments, the second light-emitting material is capable of emitting light with one of at least three colors.

In some embodiments, the first light-emitting layer is a quantum dot light-emitting layer, and a type of the first light-emitting material is different from a type of the second light-emitting material.

In another aspect, a manufacturing method of a light-emitting device is provided. The manufacturing method includes: forming a first electrode, a second electrode and a light-emitting functional layer. The first electrode and the second electrode are arranged opposite to each other, and the light-emitting functional layer is located between the first electrode and the second electrode. The light-emitting functional layer includes a first light-emitting layer, and the first light-emitting layer includes a first light-emitting material. The first light-emitting material is configured to emit light in response to a control of an electrical signal on the first electrode and an electrical signal on the second electrode. The light-emitting functional layer further includes a second light-emitting material. The second light-emitting material is configured to absorb light that does not exit from the light-emitting device in the light emitted from the first light-emitting material, and to emit light.

In some embodiments, forming the first electrode, the second electrode and the light-emitting functional layer, includes: providing a substrate; forming the first electrode on a side of the substrate; forming the light-emitting functional layer on a side of the first electrode away from the substrate; and forming the second electrode on a side of the light-emitting functional layer away from the substrate. Forming the light-emitting functional layer on the side of the first electrode away from the substrate, includes: forming a second light-emitting layer in which the second light-emitting material is disposed on the side of the first electrode away from the substrate; and forming the first light-emitting layer on a side of the second light-emitting layer away from the substrate; or forming the light-emitting functional layer on the side of the first electrode away from the substrate, includes: forming the first light-emitting layer on the side of the first electrode away from the substrate; and forming the second light-emitting layer in which the second light-emitting material is disposed on a side of the first light-emitting layer away from the substrate.

In some embodiments, forming the second light-emitting layer on the side of the first electrode away from the substrate, includes: forming the second light-emitting layer that is discontinuous on the side of the first electrode away from the substrate.

In some embodiments, the light-emitting functional layer further includes a first carrier transport layer located between the first light-emitting layer and the first electrode. Forming the first carrier transport layer, includes: mixing a first solution and a second solution including a carrier transport material, the first solution including the second light-emitting material, and a doping concentration of the second light-emitting material in the first carrier transport layer being in a range of 1% to 10%, inclusive; and coating the mixed solution, and curing the coated solution to obtain the first carrier transport layer. The first carrier transport layer doped with the second light-emitting material is a second light-emitting layer.

In yet another aspect, a display substrate is provided. The display substrate includes light-emitting devices in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on an actual size of a product, an actual process of a method and an actual timing of a signal involved in the embodiments of the present disclosure.

DETAILED DESCRIPTION

Figure 1:
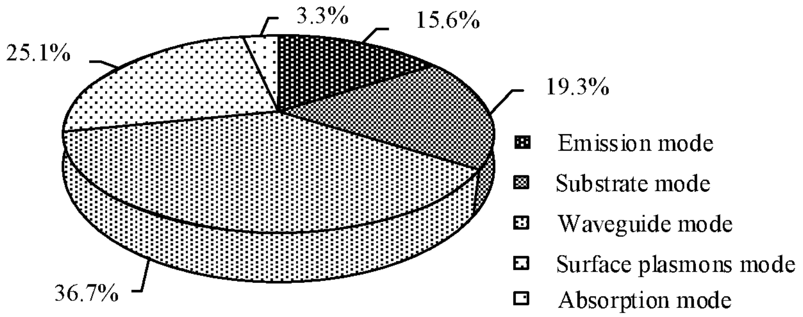
FIG. 1 is a graph showing percentages of various photon transmission modes.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phrase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, the term such as "parallel," "perpendicular" or "equal" includes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes "absolutely parallel" and "approximately parallel", and for the phrase "approximately parallel", an acceptable range of deviation may be, for example, within 5°. The term "perpendicular" includes "absolutely perpendicular" and "approximately perpendicular", and for the phrase "approximately perpendicular", an acceptable range of deviation may also be, for example, within 5°. The term "equal" includes "absolutely equal" and "approximately equal", and for the phrase "approximately equal", an acceptable range of deviation may be that, for example, a difference between two that are equal to each other is less than or equal to 5% of any one of the two.

It will be understood that when a layer or element is described as being on another layer or substrate, the layer or element may be directly on the another layer or substrate, or intermediate layer(s) may exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In recent years, a quantum dot light-emitting diode (QLED), in which fluorescent quantum dots are used as a light-emitting layer, has gradually become a promising light-emitting device. Currently, a most efficient QLED device is realized by building a hybrid "sandwich structure" with quantum dots as a light-emitting layer, organic materials as a hole transport layer, and inorganic metal oxide nanoparticles (e.g., zinc oxide nanoparticles) as an electron transport layer. Moreover, a device performance of a QLED device with cadmium-containing quantum dots as a light-emitting layer has reached a current level of development of an organic light-emitting diode (OLED) device.

Evaluation parameters of the light-emitting performance of the QLED device mainly include light-emitting efficiency, device brightness, chromaticity, operating voltage, emission spectrum and service life. The light-emitting efficiency is particularly important as an important index for measuring a performance and a quality of a device. A quantum efficiency of the QLED device is usually used as a consideration factor for the light-emitting device.

The quantum efficiency is divided into an internal quantum efficiency and an external quantum efficiency. In a case where a phosphorescent material and a multi-layer structure are used in the QLED device such that the internal quantum efficiency has almost reached 100%, a light output efficiency of only about 20% is unsatisfactory today for the QLED device.

As shown in FIG. 1, after photons are generated in a light-emitting material, in layers of a QLED device, there are following photon transmission modes: firstly, an emission mode (also referred to as direct emission), which means that photons generated in the light-emitting material exit from a glass substrate of the device successfully, secondly, a substrate mode, which means that photons are confined within the glass substrate due to waveguide effect; thirdly, an ITO mode (also referred to as absorption mode), which means that photons between an ITO layer and the glass substrate are confined within the ITO layer and an organic layer due to the waveguide effect; fourthly, waveguide mode; and fifthly, surface plasmons mode.

Due to total reflection caused by a difference between a refractive index (n=1.7 to 1.9) of each layer of the QLED device and a refractive index (n=1.5) of the glass substrate, about 50% of the photons generated in the light-emitting material are confined within the layer stack of the QLED device in the ITO mode. Similarly, due to total reflection caused by a difference between the refractive index (n=1.5) of the glass substrate and a refractive index (n=1) of air, about 30% of the photons cannot exit successfully in the substrate mode, and only about 20% of the photons can be used by people finally. The low light-emitting efficiency is a main factor restricting the development of the QLED device at present, and optimization of the QLED device to enhance the light-emitting efficiency thereof is a very important subject.

Figure 2:
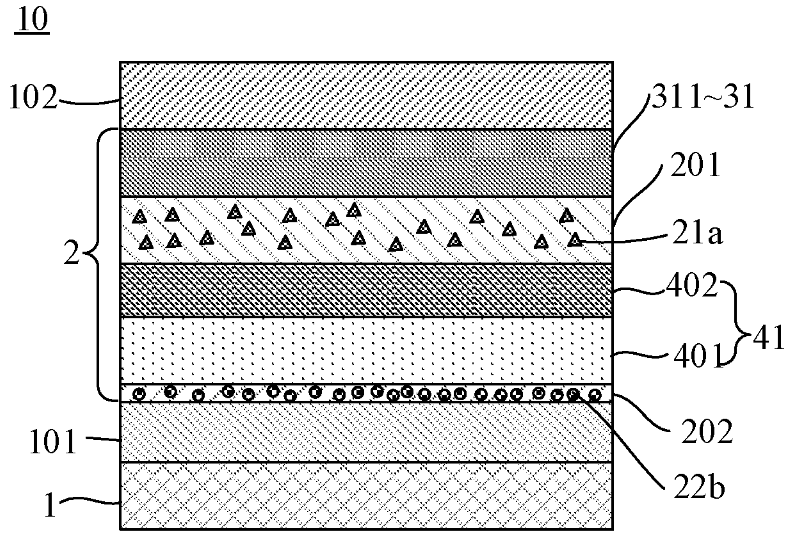
FIG. 2 is a structural diagram of a light-emitting device, in accordance with some embodiments of the present disclosure.

Based on the above problem, a light-emitting device is provided. As shown in FIG. 2, the light-emitting device 10 includes a first electrode 101 and a second electrode 102 arranged opposite to each other, and a light-emitting functional layer 2 located between the first electrode 101 and the second electrode 102. The light-emitting functional layer 2 includes a first light-emitting layer 201, and the first light-emitting layer 201 includes a first light-emitting material 21*a*. The first light-emitting material 21*a* is configured to emit light in response to a control of an electrical signal on the first electrode 101 and an electrical signal on the second electrode 102. The light-emitting functional layer 2 further includes a second light-emitting material 22*b*. A difference between a Stokes shift of the first light-emitting material 21*a* and a Stokes shift of the second light-emitting material 22*b* is in a range of 10 nm to 50 nm, inclusive.

In some embodiments, the first electrode 101 may be an anode, and in this case, the second electrode 102 is a cathode. In some other embodiments, the first electrode 101 may be a cathode, and the second electrode 102 is an anode.

For example, the anode may be made of, indium tin oxide (ITO), indium zinc oxide (IZO) or a composite material (e.g., Ag/ITO, Al/ITO, Ag/IZO or Al/IZO; a stacked structure of a metallic silver electrode and an ITO electrode is named "Ag/ITO"). A material of the cathode may be, for example, selected from Al, Ag, or Mg, or metal alloys (such as magnesium-aluminum alloy and magnesium-silver alloy).

In some examples, the first light-emitting layer 201 may be an organic light-emitting layer or a quantum dot layer.

In some examples, the second light-emitting material 22*b* is configured to absorb light that cannot exit from the light-emitting device 10 in the light emitted from the first light-emitting material 21*a*, and to emit light.

Due to the substrate mode and the ITO mode, a large number of photons in the light-emitting device 10 are confined within the device, and cannot exit as photons. Details are as described above, and will not be repeated here. In the light-emitting device in the embodiments of the present disclosure, the photons that cannot exit are utilized to emit light, so as to improve a utilization rate of the photons.

Figure 3A:
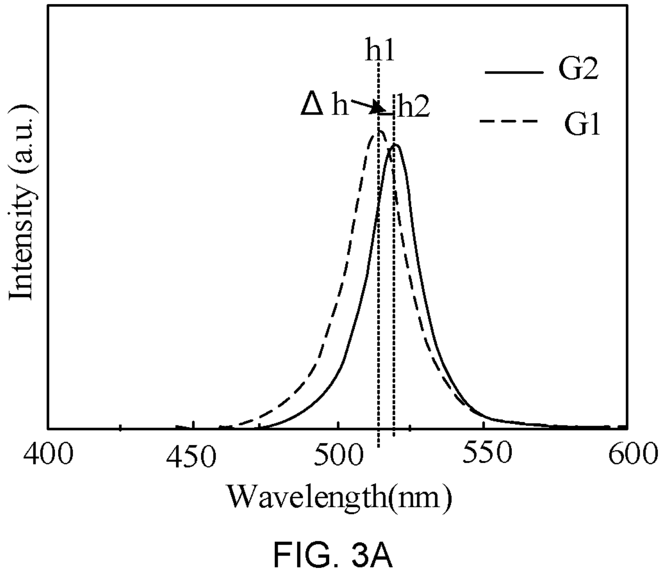
FIG. 3A is a spectrogram showing a Stokes shift, in accordance with some embodiments of the present disclosure.

In an actual application, as shown in FIG. 3A, a Stokes shift refers to a difference Δh between wavelengths h corresponding to respective highest intensities of an absorption spectrum G1 and an emission spectrum G2 (e.g., fluorescence spectrum and Raman spectrum) for the same electron transition.

For example, referring to FIG. 3A again, a wavelength corresponding to a highest intensity of an absorption spectrum G1 of a certain material is h1, a wavelength corresponding to a highest intensity of an emission spectrum G2 of the material is h2, and a Stokes shift Δh of the material is equal to an absolute value of a difference between h2 and h1 (i.e., $\Delta h=|h2-h1|$).

Figure 3B:
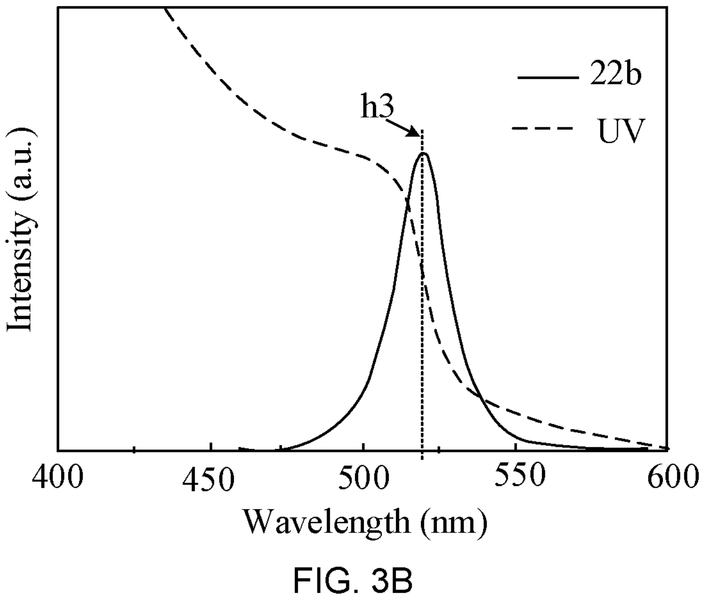
FIG. 3B is a graph showing an emission spectrum of a second light-emitting material, in accordance with some embodiments of the present disclosure.

In some example, the Stokes shift of the second light-emitting material 22*b* is in a small range. As shown in FIG. 3B, for example, the Stokes shift of the second light-emitting material 22*b* is in a range of 0 nm to 10 nm, inclusive.

For example, as shown in FIG. 3B, the ordinate in the figure indicates an intensity of light, the abscissa indicates a wavelength, the dashed line indicates a relationship between a wavelength and a light intensity of ultraviolet light (UV) providing light irradiation, and the solid line indicates a relationship between an intensity and a wavelength of light emitted from the second light-emitting material 22*b* under the irradiation of ultraviolet light (UV). It can be seen from the figure that ultraviolet light (UV) has a significantly decreased light intensity in a wavelength range of about 510 nm to 530 nm, which indicates that ultraviolet light (UV) in this wavelength range is absorbed by the second light-emitting material 22*b*, and the second light-emitting material 22*b* has a high absorptivity.

The second light-emitting material 22*b* is in an excited state after absorbing ultraviolet light (UV), and the second light-emitting material 22*b* emits light in a process in which the second light-emitting material 22*b* returns to a ground state. In FIG. 3B, a position where the intensity of the light emitted from the second light-emitting material 22*b* is strongest, i.e., a peak position of an emission spectrum of the second light-emitting material 22*b*, can be clearly seen. In this case, a peak wavelength h3 is obviously in the absorbed wavelength range (510 nm to 530 nm described above).

Therefore, it can be seen from this figure that there is a small difference between a peak wavelength (i.e., excitation peak wavelength) of the light absorbed by the second light-emitting material 22*b* and the peak wavelength (i.e., emission peak wavelength) of the light emitted from the second light-emitting material 22*b*.

Figure 3C:
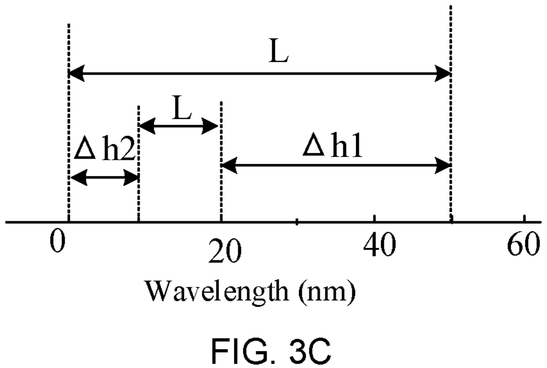
FIG. 3C is a schematic diagram showing a difference of a Stokes shift of a first light-emitting material and a Stokes shift of a second light-emitting material, in accordance with some embodiments of the present disclosure.

In some examples, the Stokes shift Δh1 of the first light-emitting material 21*a* is in a range of 20 nm to 50 nm, inclusive, and the Stokes shift Δh2 of the second light-emitting material 22*b* is in the range of 0 nm to 10 nm, inclusive. As shown in FIG. 3C, the difference L between the Stokes shift of the first light-emitting material 21*a* and the Stokes shift of the second light-emitting material 22*b* is in the range of 10 nm to 50 nm, inclusive.

Figure 3D:
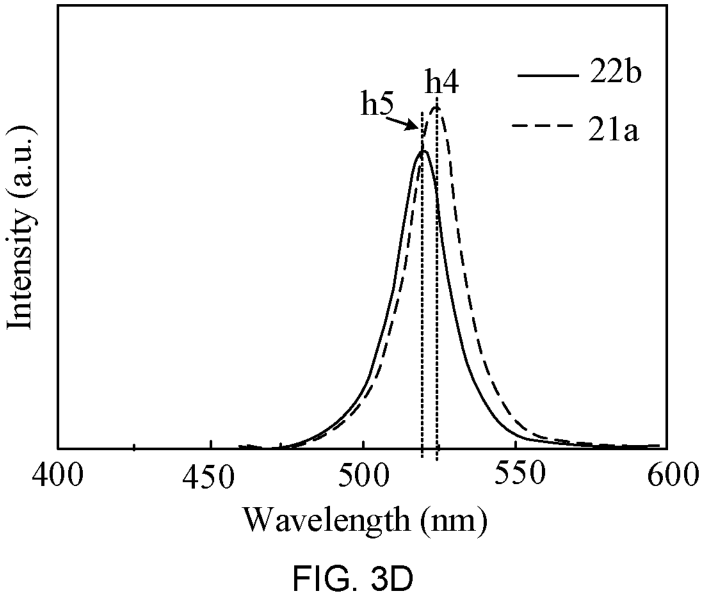
FIG. 3D is a graph showing an emission spectrum of a first light-emitting material and an absorption spectrum of a second light-emitting material, in accordance with some embodiments of the present disclosure.

In some examples, as shown in FIG. 3D, the second light-emitting material 22*b* may absorb light that cannot exit from the light-emitting device 10 in first light emitted from the first light-emitting material 21*a*, and may emit second light. A peak position of the first light emitted from the first light-emitting material 21*a* is a first peak position, and a peak position of the second light emitted from the second light-emitting material 22*b* is a second peak position. A difference between a peak wavelength h4 at the first peak position and a peak wavelength h5 at the second peak position is in a range of about 0 nm to 10 nm. That is, an absolute value of a difference between h4 and h5 is less than or equal to 10 nm (i.e., |h4−h5|≤10 nm).

It can be understood that in a case where the light-emitting functional layer 2 includes the first light-emitting material 21*a* and the second light-emitting material 22*b*, the peak wavelength of the light emitted from the first light-emitting material 21*a* is a peak wavelength of the light absorbed by the second light-emitting material 22*b*. Part of the light emitted from the first light-emitting material 21*a*, which is confined, can be absorbed by the second light-emitting material 22*b*, and the second light-emitting material 22*b* can re-emit light.

Therefore, there is a small difference between the peak wavelength of the light emitted from the first light-emitting material 21*a* and the peak wavelength (i.e., excitation peak wavelength) of the light absorbed by the second light-emitting material 22*b*, and the second light-emitting material 22*b* has a high absorptivity for the light emitted from the first light-emitting material 21*a*. Moreover, there is a small difference between the peak wavelength (i.e., emission peak wavelength) of the light emitted from the second light-emitting material 22*b* and the peak wavelength (i.e., excitation peak wavelength) of the light absorbed by the second light-emitting material 22*b*, so that a high re-emission efficiency may be ensured. That is, the second light-emitting material 22*b* has a small Stokes shift, and the peak wavelength of the light absorbed by the second light-emitting material 22*b* is close to the peak wavelength of the light emitted from the first light-emitting material 21*a*, so that the second light-emitting material 22*b* may absorb the light that cannot exit from the light-emitting device 10 in the light emitted from the first light-emitting material 21*a*, and may emit light.

A material with a small Stokes shift is selected as the second light-emitting material 22*b*, which is based on the following principle.

Theoretically, some quantum dot materials may absorb a large amount of light emitted from the first light-emitting material 21*a* in the first light-emitting layer 201, and then re-emit light. However, there is a large difference between a peak wavelength (i.e., emission peak wavelength) of the light re-emitted from such quantum dot material and the peak wavelength (i.e., excitation peak wavelength) of the light emitted from the first light-emitting material 21*a* in the first light-emitting layer 201, so that photons cannot be ensured to exit from the device again. There are also other quantum dot materials that may emit light with the same peak wavelength as the light emitted from the first light-emitting material 21*a* in the first light-emitting layer 201. However, such quantum dot materials have a low absorptivity for the light emitted from the first light-emitting material 21*a* in the first light-emitting layer 201, and cannot fully absorb the photons confined within the glass substrate and the photons confined within the ITO layer and the organic layer.

Therefore, a material with a high absorptivity for the light emitted from the first light-emitting material 21*a* in the first light-emitting layer 201 is required. Moreover, there is a small difference between a peak wavelength (i.e., emission peak wavelength) of light emitted from such material and the peak wavelength (i.e., excitation peak wavelength) of the light emitted from the first light-emitting material 21*a* in the first light-emitting layer 201. That is, the material itself has a small Stokes shift, and a peak wavelength of light absorbed by the material is close to the peak wavelength of the light emitted from the first light-emitting material 21*a*. In this way, the absorptivity for the light emitted from the first light-emitting material 21*a* in the first light-emitting layer 201 may be ensured, and light with a peak wavelength similar to that of the light emitted from the first light-emitting material 21*a* in the first light-emitting layer 201 may be emitted, so that light re-emission of the device may be ensured to improve the quantum efficiency of the light-emitting device.

Therefore, the second light-emitting material 22*b* is disposed in the light-emitting device, so that the confined part of the light emitted from the first light-emitting material 21*a* may be effectively absorbed, and the light with a wavelength slightly different from the peak wavelength of the light emitted from the first light-emitting material 21*a* may exit, thereby ensuring the light re-emission of the light-emitting device to improve the quantum efficiency of the light-emitting device.

In some embodiments, a mass ratio of the second light-emitting material 22*b* to the first light-emitting material 21*a* is in a range of 0.1% to 10%, inclusive.

For example, the mass ratio of the second light-emitting material 22*b* to the first light-emitting material 21*a* is 0.1%, 2%, 5%, 8% or 10%, which is not limited here.

The mass ratio of the second light-emitting material 22*b* to the first light-emitting material 21*a* is set to be in the range of 0.1% to 10%, so that the second light-emitting material 22 may absorb the light that cannot exit from the light-emitting device 10 in the light emitted from the first light-emitting material 21*a*, and may emit light, thereby improving an external quantum efficiency of the light-emitting device.

Figure 4:
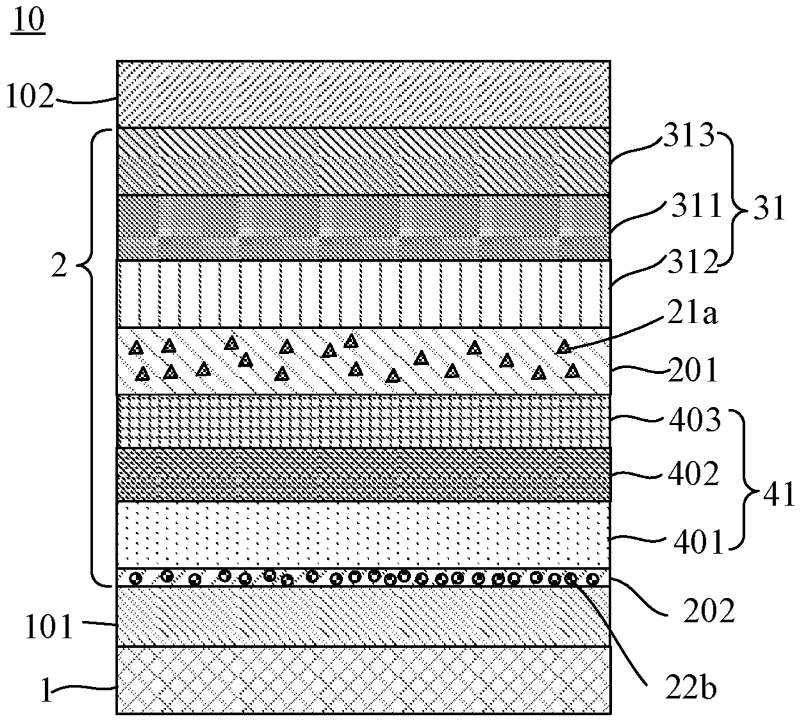
FIG. 4 is a structural diagram of another light-emitting device, in accordance with some embodiments of the present disclosure.
Figure 5:
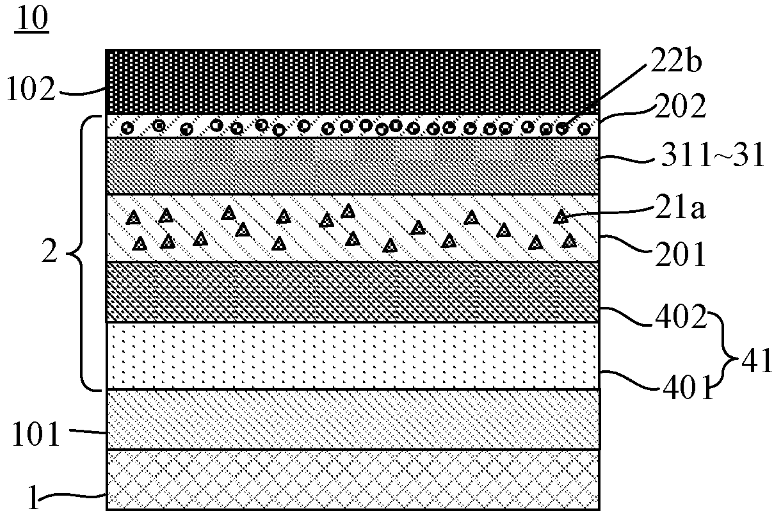
FIG. 5 is a structural diagram of yet another light-emitting device, in accordance with some embodiments of the present disclosure.

In some embodiments, as shown in FIGS. 2, 4 and 5, the light-emitting functional layer 2 further includes a first carrier transport layer 41 located between the first light-emitting layer 201 and the first electrode 101, and a second carrier transport layer 31 located between the first light-emitting layer 201 and the second electrode 102. The second light-emitting material 22*b* is located between the first carrier transport layer 41 and the first electrode 101, and/or the second light-emitting material 22*b* is located between the second carrier transport layer 31 and the second electrode 102. A film layer in which the second light-emitting material 22*b* is disposed is a second light-emitting layer 202.

In some examples, as shown in FIGS. 2 and 4, the first carrier transport layer 41 and the first electrode 101 are provided with a second light-emitting layer 202 therebetween. As shown in FIG. 5, the second carrier transport layer 31 and the second electrode 102 are provided with a second light-emitting layer 202 therebetween. It can be understood that the first carrier transport layer 41 and the first electrode 101 may be provided with the second light-emitting layer 202 therebetween, and the second carrier transport layer 31 and the second electrode 102 may be provided with the second light-emitting layer 202 therebetween, which is not limited here.

In some embodiments, as shown in FIGS. 2 and 4 to 6, the first carrier transport layer 41 includes at least one of a hole injection layer 401, a hole transport layer 402 and an electron blocking layer 403. The second carrier transport layer 31 includes at least one of an electron injection layer 313, an electron transport layer 311 and a hole blocking layer 312.

In some examples, as shown in FIG. 2, the first carrier transport layer 41 includes the hole injection layer 401 and the hole transport layer 402 that are sequentially stacked in a direction away from the first electrode 101. The second light-emitting layer 202 is located between the first electrode 101 and the hole injection layer 401. Since the confinement of photons is strongest at an interface of different film layers regardless of the waveguide mode, the substrate mode or the surface plasmons mode, the second light-emitting layer 202 is located between the first electrode 101 and the hole injection layer 401, so that the second light-emitting layer 202 may absorb the light that cannot exit from the light-emitting device 10 in the light emitted from the first light-emitting material 21*a*, and may emit light. Moreover, the design of the second light-emitting layer 202 located between the first electrode 101 and the hole injection layer 401 may increase the injection of holes. The second carrier transport layer 31 includes the electron transport layer 311.

In some examples, as shown in FIG. 4, the first carrier transport layer 41 includes the hole injection layer 401, the hole transport layer 402 and the electron blocking layer 403 that are sequentially stacked in the direction away from the first electrode 101. The second light-emitting layer 202 is located between the first electrode 101 and the hole injection layer 401. The second carrier transport layer 31 includes the electron injection layer 313, the electron transport layer 311 and the hole blocking layer 312 that are sequentially stacked in a direction towards the first electrode 101.

In some examples, as shown in FIG. 5, the first carrier transport layer 41 includes the hole injection layer 401 and the hole transport layer 402 that are sequentially stacked in the direction away from the first electrode 101. The second carrier transport layer 31 includes the electron transport layer 311, and the second light-emitting layer 202 is located between the second electrode 102 and the electron transport layer 311.

Figure 6:
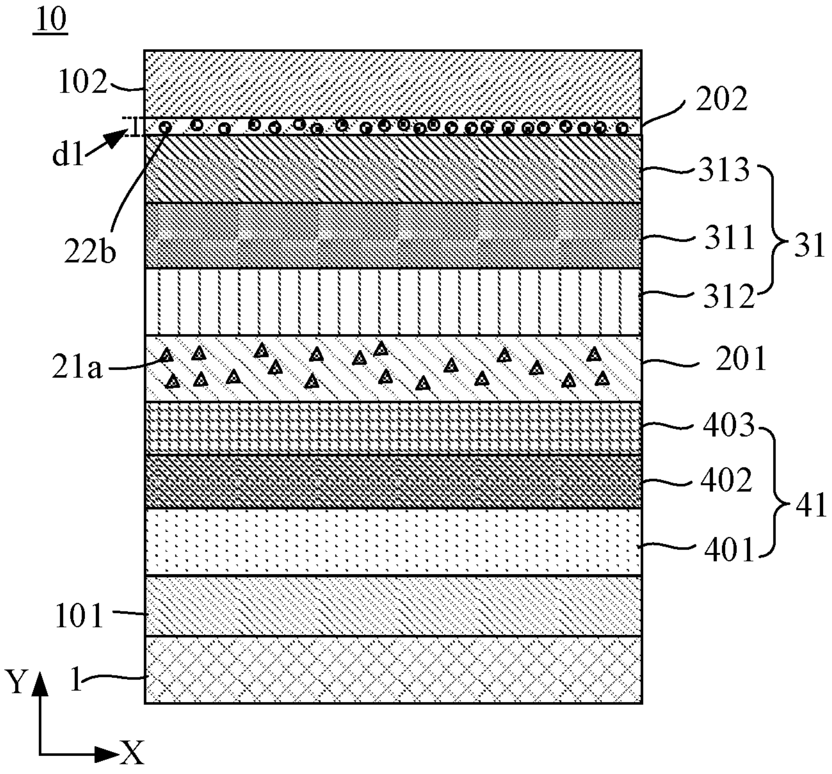
FIG. 6 is a structural diagram of yet another light-emitting device, in accordance with some embodiments of the present disclosure.

In some examples, as shown in FIG. 6, the first carrier transport layer 41 includes the hole injection layer 401, the hole transport layer 402 and the electron blocking layer 403 that are sequentially stacked in the direction away from the first electrode 101. The second carrier transport layer 31 includes the electron injection layer 313, the electron transport layer 311 and the hole blocking layer 312 that are sequentially stacked in the direction towards the first electrode 101. The second light-emitting layer 202 is located between the second electrode 102 and the electron injection layer 313.

It will be noted that as shown in FIGS. 2 and 4 to 6, the structures of the first carrier transport layer 41 and the second carrier transport layer 31 are exemplarily described above, but the scope of the present disclosure is not limited thereto.

For example, a material of the hole injection layer 401 may include Poly(3,4-ethylenedioxythiophene), polystyrene sulfonate, or other compound suitable for the hole injection layer, which is not limited here.

For example, a material of the hole transport layer 402 may include poly(9,9-dioctylfluorene-co-N-(4-butylphenyl) diphenylamine) (TFB) or Poly(N-vinylcarbazole) (PVK), which is not limited here.

For example, a material of the electron blocking layer 403 may include 4,4'-Cyclohexylidenebis[N,N-bis(4-methylphenyl)aniline] or 4,4',4"-Tris(carbazol-9-yl)-triphenylamine, which is not limited here. The electron blocking layer 403 functions to block diffusion of electrons transported from the first light-emitting layer 201, and confines the electrons and the holes in a light-emitting region, so as to improve the efficiency.

For example, a material of the electron injection layer 313 may be selected from metals, such as Li, Ca and Yb, or selected from metal salts, such as LiF and $LiQ_3$, which is not limited here.

For example, the electron transport layer 311 may include a zinc oxide nanoparticle film or a zinc oxide sol-gel film, which is not limited here.

For example, the hole blocking layer 312 may be made of 2,9-Dimethyl-4,7-diphenyl-1,10-phenanthroline, and has a good hole blocking ability.

Figure 7:
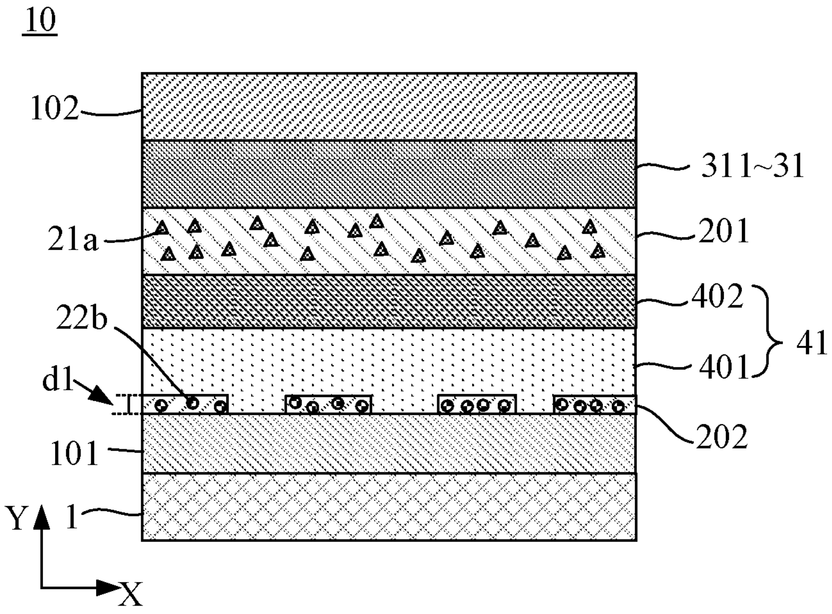
FIG. 7 is a structural diagram of yet another light-emitting device, in accordance with some embodiments of the present disclosure.

In some embodiments, as shown in FIG. 7, the second light-emitting layer 202 is a discontinuous film layer.

In some examples, referring to FIG. 7 again, the first carrier transport layer 41 includes the hole injection layer 401 and the hole transport layer 402 that are sequentially stacked in the direction away from the first electrode 101. The second light-emitting layer 202 is located between the first electrode 101 and the hole injection layer 401, and the second light-emitting layer 202 is a discontinuous film layer. That is, a direction in which the film layers are stacked is a first direction Y, and a direction perpendicular to the first direction Y is a second direction X. The second light-emitting layer 202 is in a disconnected state on a plane perpendicular to the first direction Y, and the second light-emitting layer 202 is not a film layer entirely covering the first electrode 101.

In a case where the second light-emitting layer 202 is the discontinuous film layer, the second light-emitting layer 202 not only may reuse the confined photons in the substrate mode to improve the device performance, but also may weaken an influence of the film waveguide effect by arranging the discontinuous film layer, so that the waveguide mode of the device is partially broken, and the confined photons in the substrate mode are reduced.

It will be noted that the light-emitting device 10 further includes other films. Details are as described above, and will not be repeated here.

In some embodiments, as shown in FIGS. 6 and 7, a film thickness d1 of the second light-emitting layer 202 is in a range of 5 nm to 20 nm, inclusive.

In some examples, as shown in FIG. 6, the film thickness d1 of the second light-emitting layer 202 is a dimension of the second light-emitting layer 202 in the first direction Y. The film thickness d1 of the second light-emitting layer 202 may be 5 nm, 10 nm, 15 nm, 18 nm or 20 nm, which is not limited here.

In some examples, as shown in FIG. 7, the second light-emitting layer 202 is the discontinuous film layer. A film thickness d1 of a region of the second light-emitting layer 202 where a film layer is formed may be 5 nm, 8 nm, 12 nm, 16 nm, or 20 nm, which is not limited here.

Figure 8:
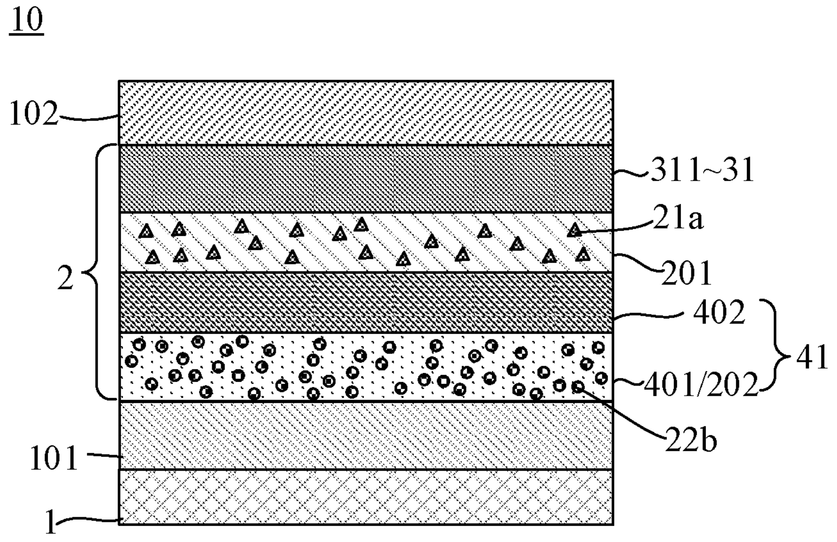
FIG. 8 is a structural diagram of yet another light-emitting device, in accordance with some embodiments of the present disclosure.
Figure 9:
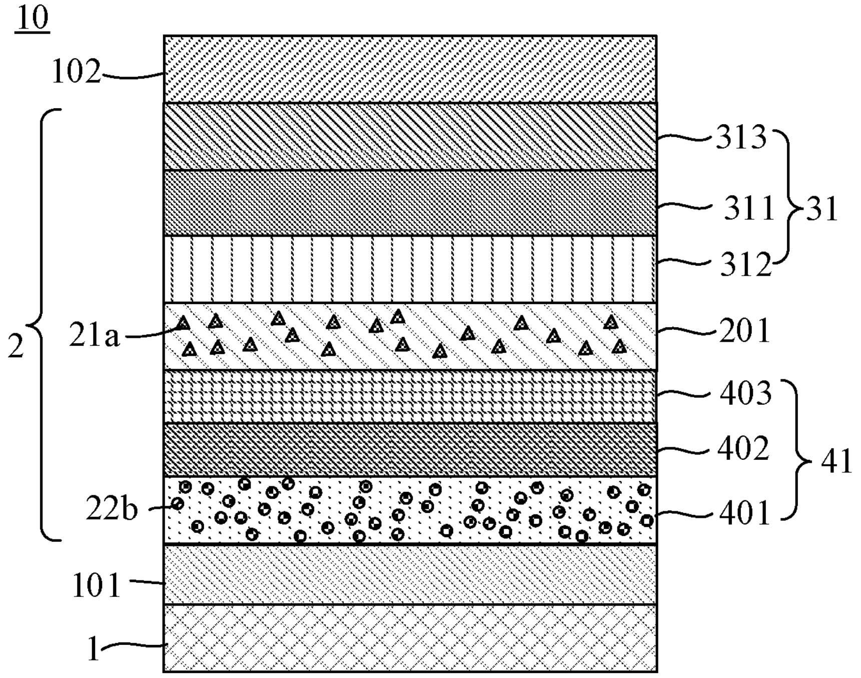
FIG. 9 is a structural diagram of yet another light-emitting device, in accordance with some embodiments of the present disclosure.

In some embodiments, as shown in FIGS. 8 and 9, the light-emitting functional layer 2 further includes first carrier transport layer(s) 41 located between the first light-emitting layer 201 and the first electrode 101. The first carrier transport layer(s) are doped with the second light-emitting material 22*b*. The first carrier transport layer 41 doped with the second light-emitting material 22*b* is a second light-emitting layer 202.

In some examples, referring to FIGS. 8 and 9 again, the second light-emitting layer 202 in the light-emitting device 10 is formed by doping the first carrier transport layer 41 with the second light-emitting material 22*b*, which is different from the above embodiments as shown in FIGS. 2 and 4 to 7 in which the second light-emitting layer 202 is a film layer formed separately from the first carrier transport layer 41 and the second carrier transport layer 31.

In some embodiments, referring to FIGS. 8 and 9 again, the first carrier transport layer(s) 41 include a hole injection layer 401, and the second light-emitting material 22*b* is located in the hole injection layer 401.

That is, the second light-emitting material **22*b* is doped in the hole injection layer 401, and the hole injection layer 401 forms the second light-emitting layer 202**. A specific process refers to a description of a manufacturing method, and will not be repeated here.

In some embodiments, a doping concentration of the second light-emitting material **22*b* in the first carrier transport layer 41** is in a range of 1% to 10%, inclusive.

For example, the doping concentration of the second light-emitting material **22*b* in the first carrier transport layer 41** is 1%, 3%, 5%, 7%, 9% or 10%, which is not limited here.

In some embodiments, referring to FIG. 9 again, the second light-emitting material **22*b* is doped in the hole injection layer 401, and the first carrier transport layer(s) 41 further include at least one of a hole transport layer 402 and an electron blocking layer 403. The light-emitting functional layer 2 further includes second carrier transport layer(s) 31 located between the first light-emitting layer 201 and the second electrode 102. The second carrier transport layer(s) 31 include at least one of an electron injection layer 313, an electron transport layer 311 and a hole blocking layer 312**.

For example, as shown in FIG. 8, the second light-emitting material **22*b* is doped in the hole injection layer 401, and the first carrier transport layer(s) 41 further include the hole transport layer 402. The light-emitting functional layer 2 further includes the second carrier transport layer(s) 31 located between the first light-emitting layer 201 and the second electrode 102. The second carrier transport layer(s) 31 include the electron transport layer 311**.

For example, as shown in FIG. 9, the second light-emitting material **22*b* is doped in the hole injection layer 401, and the first carrier transport layer(s) 41 further include the hole transport layer 402 and the electron blocking layer 403. The light-emitting functional layer 2 further includes the second carrier transport layer(s) 31 located between the first light-emitting layer 201 and the second electrode 102. The second carrier transport layer(s) 31 include the electron injection layer 313, the electron transport layer 311 and the hole blocking layer 312**.

It will be noted that the structure of the light-emitting device 10 is described by taking the light-emitting device 10 shown in FIG. 8 or FIG. 9 as an example, but the structure of the light-emitting device 10 is not limited thereto.

In some embodiments, the second light-emitting material **22*b*** is a perovskite quantum dot material. A Stokes shift of the perovskite quantum dot material is in a range of 0 nm to 10 nm, inclusive.

According to the above analysis of the principle of using the second light-emitting material **22*b*, it can be known that the second light-emitting material 22*b*** should be a material with a small Stokes shift, and the perovskite quantum dot material satisfies the characteristic of the small stokes shift.

In some embodiments, a particle size of the perovskite quantum dot material is in a range of 10 nm to 110 nm, inclusive.

For example, the particle size of the perovskite quantum dot material is 10 nm, 20 nm, 30 nm, 50 nm, 70 nm, 90 nm, 100 nm, or 110 nm, which is not limited here.

In some embodiments, a chemical formula of the perovskite quantum dot material is $CsPbX_3$, and X represents one of halogens.

For example, the halogen represented by X may be bromine (Br), chlorine (CI) or iodine (I). In a case where X represents bromine (Br), a corresponding chemical formula of the perovskite quantum dot material is $CsPbBr_3$. In a case where X represents chlorine (CI), a corresponding chemical formula of the perovskite quantum dot material is $CsPbCl_3$. In a case where X represents iodine (I), a corresponding chemical formula of the perovskite quantum dot material is $CsPbI_3$.

As an excellent semiconductor material, the perovskite material (e.g., $CsPbX_3$ quantum dots in which X represents halogen such as bromine (Br), chlorine (CI) or iodine (I)) has a very small Stokes shift and a high fluorescence quantum yield. That is, the perovskite material may absorb light emitted from the perovskite material itself, and may re-emit light with a peak position similar to that of the light absorbed by the perovskite material.

In some embodiments, the second light-emitting material **22*b*** may emit light with one of at least three different colors.

For example, in a case where the second light-emitting material **22*b* is the $CsPbBr_3$ quantum dot material, the second light-emitting layer 202 can emit green light, and a device in which the second light-emitting layer 202 includes the $CsPbBr_3$ quantum dots is referred to as a green device. In a case where the second light-emitting material 22*b* is the $CsPbCl_3$ quantum dot material, the second light-emitting layer 202 can emit blue light, and a device in which the second light-emitting layer 202 includes the $CsPbCl_3$ quantum dots is referred to as a blue device. In a case where the second light-emitting material 22*b* is the $CsPbI_3$ quantum dot material, the second light-emitting layer 202 can emit red light, and a device in which the second light-emitting layer 202** includes the $CsPbI_3$ quantum dots is referred to as a red device. Green, blue and red are three primary colors.

In some embodiments, the first light-emitting layer 201 is a quantum dot light-emitting layer, and a type of the first light-emitting material **21*a* is different from a type of the second light-emitting material 22*b***.

For example, the first light-emitting layer 201 is a quantum dot layer, and the first light-emitting material **21*a* in the quantum dot layer may include at least one of CdS, CdSe, CdTe, ZnSe, InP, PbS, $CuInS_2$, ZnO, $CsPbCl_3$, $CsPbBr_3$, $CsPbI_3$, CdS/ZnS, CdSe/ZnS, InP/ZnS, PbS/ZnS, InAs, InGaAs, InGaN, GaNK, ZnTe, Si, Ge and C. The first light-emitting material 21*a* is CdS/ZnS, CdSe/ZnS, InP/ZnS or PbS/ZnS, which means that the first light-emitting material 21*a* has a core-shell structure in which one material is a core material and another material is a shell material. For example, the first light-emitting material 21*a*** is CdS/ZnS, which means that quantum dots have a core material of CdS and a shell material of ZnS.

In some other examples, the first light-emitting material **21*a*** may be other nano-scale material, such as nanorods or nanosheets. The composition of the other nano-scale material may include at least one of CdS, CdSe, CdTe, ZnSe, InP, PbS, $CuInS_2$, ZnO, $CsPbCl_3$, $CsPbBr_3$, $CsPbI_3$, CdS/ZnS, CdSe/ZnS, InP/ZnS, PbS/ZnS, InAs, InGaAs, InGaN, GaNK, ZnTe, Si, Ge and C.

In some embodiments, the quantum dots in the first light-emitting layer 201 are cadmium-free quantum dots.

The quantum dots in the first light-emitting layer 201 are the cadmium-free quantum dots, so that a toxicity of the nano light-emitting material may be reduced, and environmental pollution may be reduced.

In some embodiments, the type of the first light-emitting material **21*a* may be the same as the type of the second light-emitting material 22*b*. For example, the first light-emitting material 21*a* and the second light-emitting material 22*b*** are perovskite quantum dot materials.

Figure 10:
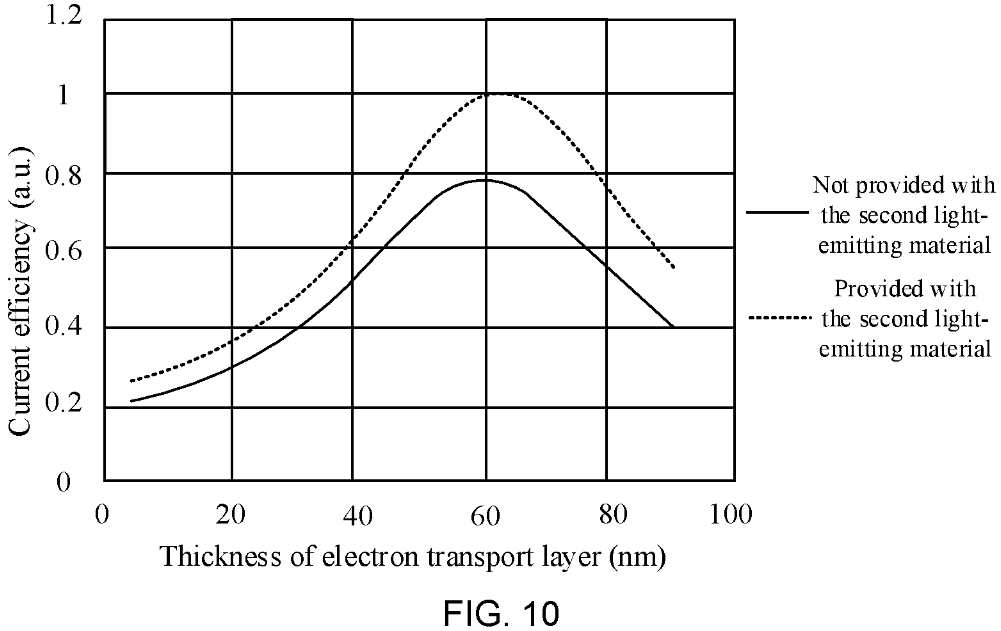
FIG. 10 is a graph showing current efficiencies of light-emitting devices, in accordance with some embodiments of the present disclosure.

The second light-emitting material **22*b* is disposed in the light-emitting device 10, and the second light-emitting material 22*b* may absorb the light that cannot exit from the light-emitting device 10 in the light emitted from the first light-emitting material 21***a*, and may emit light, so that the light output efficiency of the light-emitting device 10 is improved. As shown in FIG. 10, the horizontal axis indicates a thickness (nm) of an electron transport layer, the vertical axis indicates a current efficiency (a.u.), the solid line is a curve of a thickness of an electron transport layer vs. a current efficiency for the light-emitting device in which the second light-emitting material 22*b* is not disposed, and the dashed line is a curve of a thickness of an electron transport layer vs. a current efficiency for the light-emitting device in which the second light-emitting layer 202 is disposed. It can be seen from this figure that the light-emitting device in which the second light-emitting material 22*b* is disposed has a higher current efficiency, which indicates that the light-emitting device in which the second light-emitting material 22*b* is disposed has a higher light output efficiency. That is, the external quantum efficiency of the light-emitting device is improved.

In some embodiments, a second aspect of the present disclosure provides a manufacturing method of a light-emitting device. The manufacturing method includes: forming a first electrode 101, a second electrode 102 and a light-emitting functional layer 2. As shown in FIG. 2, the first electrode 101 and the second electrode 102 are arranged opposite to each other, and the light-emitting functional layer 2 is located between the first electrode 101 and the second electrode 102. The light-emitting functional layer 2 includes a first light-emitting layer 201, and the first light-emitting layer 201 includes a first light-emitting material 21*a*. The first light-emitting material 21*a* is configured to emit light in response to a control of an electrical signal on the first electrode 101 and an electrical signal on the second electrode 102. The light-emitting functional layer 2 further includes a second light-emitting material 22*b*. The second light-emitting material 22*b* is configured to absorb light that cannot exit from the light-emitting device 10 in the light emitted from the first light-emitting material 21*a*, and to emit light.

The principle analysis that the second light-emitting material 22*b* may absorb the light that cannot exit from the light-emitting device 10 in the light emitted from the first light-emitting material 21*a* and emit light to improve the external quantum efficiency of the light-emitting device is as described above, and will not be repeated here.

Figure 11:
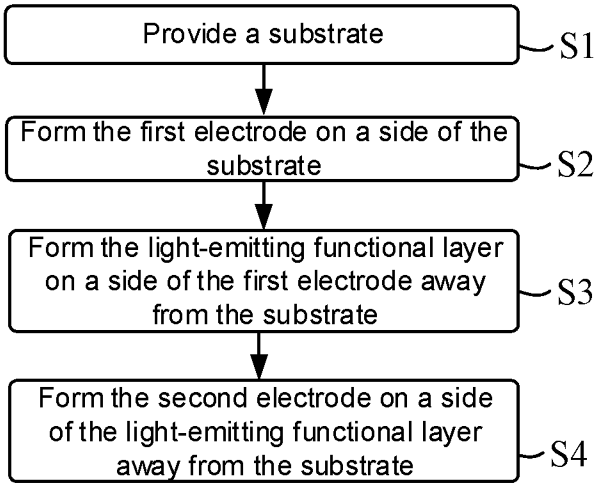
FIG. 11 is a flow diagram of a manufacturing method of a light-emitting device, in accordance with some embodiments of the present disclosure.

In some examples, as shown in FIG. 11, forming the first electrode 101, the second electrode 102 and the light-emitting functional layer 2 in the manufacturing method of the light-emitting device, includes S1 to S4.

In S1, a substrate 1 is provided.

In some examples, the substrate may be a rigid substrate. For example, the substrate is made of a conductive glass.

In some examples, the substrate may be a flexible substrate. For example, the substrate is made of an organic material.

In a case where the substrate is the rigid substrate, before S1, cleaning the substrate in S0 is further included.

For example, the substrate is ultrasonically cleaned by using isopropanol, water or acetone, and may be irradiated for 5 min to 10 min by using ultraviolet light after the cleaning is completed.

In S2, the first electrode 101 is formed on a side of the substrate 1.

For example, the first electrode 101 may be an anode. An anode layer is formed on the substrate 1 by using an evaporation process. The anode layer may be made of aluminum, silver or indium tin oxide.

In S3, the light-emitting functional layer 2 is formed on a side of the first electrode 101 away from the substrate 1.

In S4, the second electrode 102 is formed on a side of the light-emitting functional layer 2 away from the substrate 1.

For example, the second electrode 102 may be a cathode. A cathode layer may be formed by using an evaporation process or a sputtering process.

For example, a material of the cathode layer may include metal such as aluminum copper or silver, or may include indium tin oxide or indium zinc oxide.

For example, the cathode layer includes electrodes arranged as a whole layer.

Figure 12:
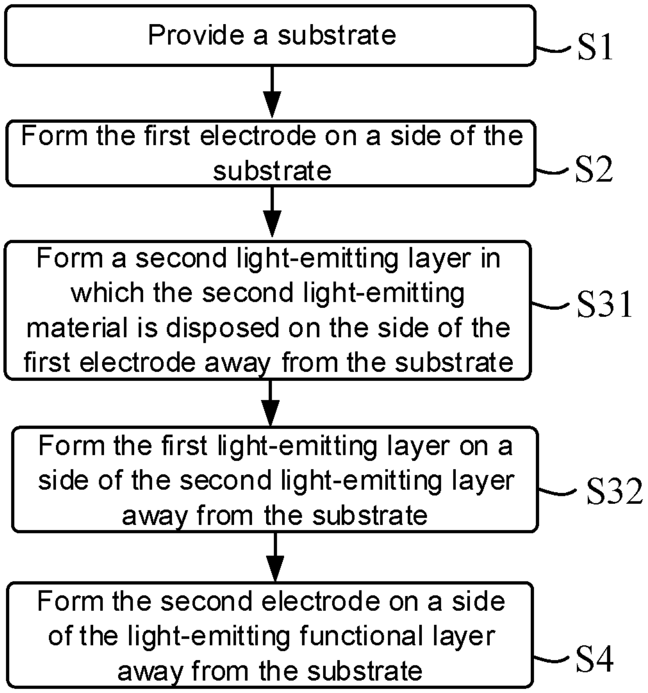
FIG. 12 is another flow diagram of a manufacturing method of a light-emitting device, in accordance with some embodiments of the present disclosure.

As shown in FIG. 12, the step of forming the light-emitting functional layer 2 on the side of the first electrode 101 away from the substrate 1 includes S31 and S32.

In S31, a second light-emitting layer 202 in which the second light-emitting material 22*b* is disposed is formed on the side of the first electrode 101 away from the substrate 1.

In S32, the first light-emitting layer 201 is formed on a side of the second light-emitting layer 202 away from the substrate 1.

Figure 13:
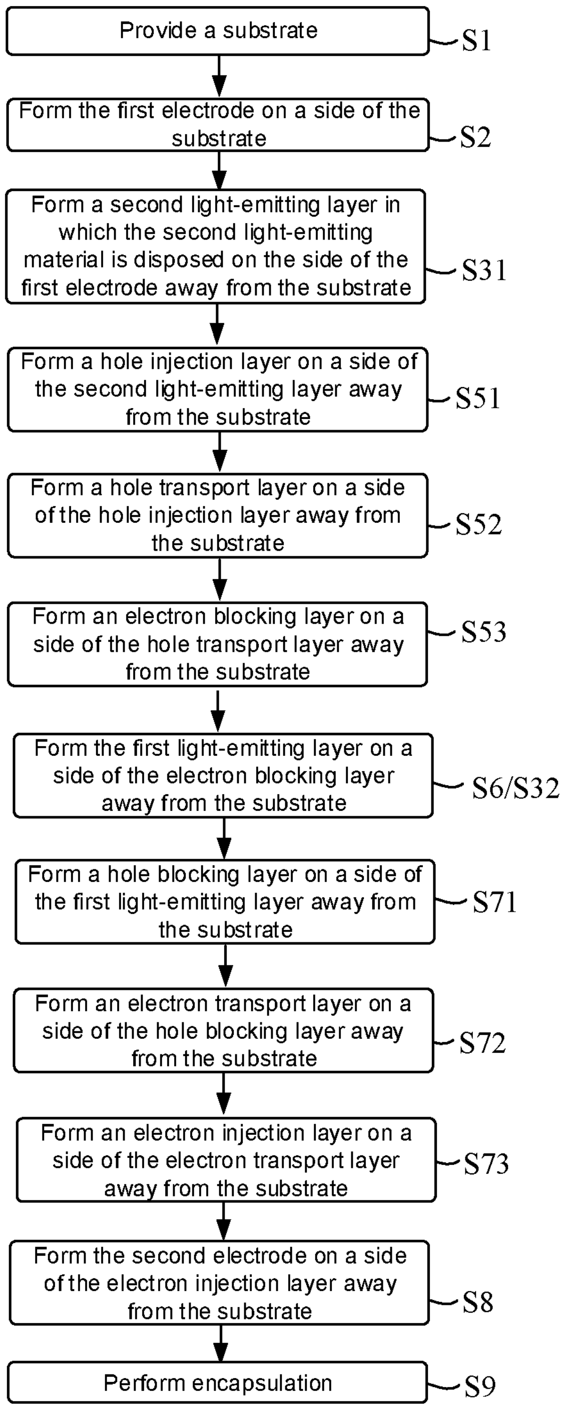
FIG. 13 is a step diagram of a manufacturing method of a light-emitting device, in accordance with some embodiments of the present disclosure.

In some examples, in an example where the light-emitting device 10 as shown in FIG. 4 is formed, as shown in FIG. 13, specific steps of the manufacturing method of the light-emitting device 10 include following S1 to S9.

In S1, the substrate 1 is provided.

Figure 14:
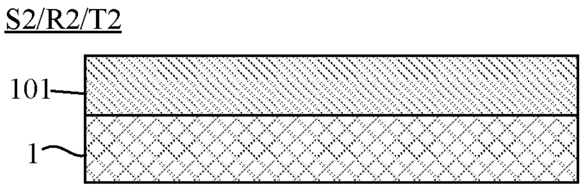
FIGS. 14 to 22 are step diagrams of a manufacturing method of a light-emitting device, in accordance with some embodiments of the present disclosure.

In S2, as shown in FIG. 14, the first electrode 101 is formed on the side of the substrate 1.

For example, the first electrode 101 may be an anode.

Figure 15:
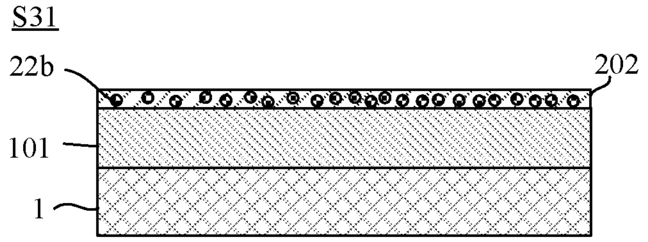

In S31, as shown in FIG. 15, the second light-emitting layer 202 in which the second light-emitting material 22*b* is disposed is formed on the side of the first electrode 101 away from the substrate 1.

For example, the perovskite (e.g., $CsPbBr_3$) quantum dot material is spin coated by using a spin coater in a nitrogen atmosphere, and is annealed at 130° C. to 150° C. for ten minutes in the nitrogen atmosphere. A film thickness is adjusted according to a concentration of the quantum dots and a rotation speed.

For example, the rotation speed of the spin coater may be in a range of 2000 rpm to 5000 rpm, inclusive. The concentration of the quantum dots is in a range of 1 mg/mL to 20 mg/mL, inclusive. The thickness of the formed second light-emitting layer 202 is in a range of 5 nm to 20 nm, inclusive.

For example, in an example where the perovskite quantum dot material is $CsPbBr_3$, a manufacturing method of the perovskite quantum dot material includes M1 to M3.

In M1, 0.407 g of cesium carbonate powders, 20 ml of octadecene and 1 ml of an oleic acid solution are mixed, stirred and heated to 120° C. in a vacuum environment, and are reacted for 1 h, and then are continuously heated to 150° C. in an argon atmosphere until cesium carbonate is completely dissolved, so as to obtain a $Cs^+$ precursor solution. The $Cs^+$ precursor solution is stored at 120° C.

In M2, 1.378 g of lead bromide powders and 20 ml of an octadecene solution are mixed, and are heated at 120° C. for 1 h in the nitrogen atmosphere. Then, 1 ml of a dried oleic acid solution and 1 ml of a dried dodecylamine solution are added to the foregoing mixed solution, and the temperature is slowly raised to 180° C. After the temperature is stabilized, the stirring is stopped, and the $Cs^+$ precursor solution is slowly injected into the mixed solution to be immediately subjected to an ice bath after 5 s to 10 s, so as to obtain a suspension containing $CsPbBr_3$ perovskite quantum dots. The suspension is centrifuged for 10 min by using a centrifuge at 7000 rpm, an upper oily liquid is discarded, and a precipitate is washed several times.

In M3, the precipitate is finally dissolved in toluene to prepare a $CsPbBr_3$ perovskite quantum dot solution with a concentration of 1 mg/ml to 20 mg/ml for later use.

For example, in an example where the perovskite quantum dot material is $CsPbI_3$, a manufacturing method of the perovskite quantum dot material includes U1 to U3.

In U1, 0.407 g of cesium carbonate powders, 20 ml of octadecene and 1 ml of an oleic acid solution are mixed, stirred and heated to 120° C. in the vacuum environment, and are reacted for 1 h, and then are continuously heated to 150° C. in the argon atmosphere until cesium carbonate is completely dissolved, so as to obtain a $Cs^+$ precursor solution. The $Cs^+$ precursor solution is stored at 120° C.

In U2, 1.73 g of lead iodide powders and 20 ml of an octadecene solution are mixed, and are heated at 120° C. for 1 h in the nitrogen atmosphere. Then, 1 ml of a dried oleic acid solution and 1 ml of a dried dodecylamine solution are added to the foregoing mixed solution, and the temperature is slowly raised to 180° C. After the temperature is stabilized, the stirring is stopped, and the $Cs^+$ precursor solution is slowly injected into the mixed solution to be immediately subjected to an ice bath after 5 s to 10 s, so as to obtain a suspension containing $CsPbI_3$ perovskite quantum dots. The suspension is centrifuged for 10 min by using a centrifuge at 7000 rpm, an upper oily liquid is discarded, and a precipitate is washed several times.

In U3, the precipitate is finally dissolved in toluene to prepare a $CsPbI_3$ perovskite quantum dot solution with a concentration of 1 mg/ml to 20 mg/ml for later use.

For example, in an example where the perovskite quantum dot material is $CsPbCl_3$, a manufacturing method of the perovskite quantum dot material includes W1 to W3.

In W1, 0.407 g of cesium carbonate powders, 20 ml of octadecene and 1 ml of an oleic acid solution are mixed, stirred and heated to 120° C. in the vacuum environment, and are reacted for 1 h, and then are continuously heated to 150° C. in the argon atmosphere until cesium carbonate is completely dissolved, so as to obtain a $Cs^+$ precursor solution. The $Cs^+$ precursor solution is stored at 120° C.

In W2, 1.042 g of lead chloride powders and 20 ml of an octadecene solution are mixed, and are heated at 120° C. for 1 h in the nitrogen atmosphere. Then, 1 ml of a dried oleic acid solution and 1 ml of a dried dodecylamine solution are added to the foregoing mixed solution, and the temperature is slowly raised to 180° C. After the temperature is stabilized, the stirring is stopped, and the $Cs^+$ precursor solution is slowly injected into the mixed solution to be immediately subjected to an ice bath after 5 s to 10 s, so as to obtain a suspension containing $CsPbCl_3$ perovskite quantum dots. The suspension is centrifuged for 10 min by using a centrifuge at 7000 rpm, an upper oily liquid is discarded, and a precipitate is washed several times.

In W3, the precipitate is finally dissolved in toluene to prepare a $CsPbCl_3$ perovskite quantum dot solution with a concentration of 1 mg/ml to 20 mg/ml for later use.

Figure 16:
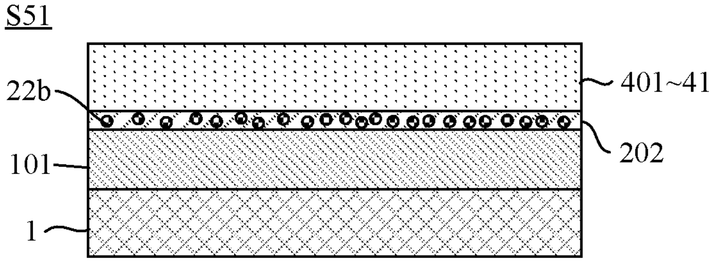

In S51, as shown in FIG. 16, a hole injection layer 401 is formed on a side of the second light-emitting layer 202 away from the substrate 1.

For example, the hole injection layer 401 may be formed by spin coating, evaporation or inkjet printing. A material of the hole injection layer 401 may be selected from Poly(3,4-ethylenedioxythiophene), polystyrene sulfonate, or other compound suitable for the hole injection layer. A film formation temperature of Poly(3,4-ethylenedioxythiophene) may be in a range of 130° C. to 150° C., inclusive.

For example, in a case where the hole injection layer 401 is formed by spin coating, the rotation speed of the spin coater may be in a range of 500 rpm to 2500 rpm, inclusive. A thickness of the hole injection layer 401 may be adjusted by adjusting the rotation speed of the spin coater.

Figure 17:
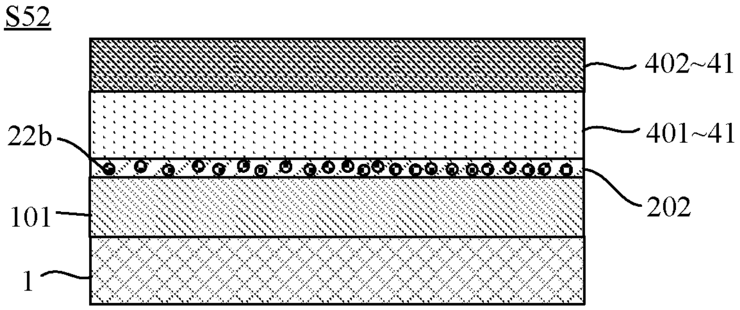

In S52, as shown in FIG. 17, a hole transport layer 402 is formed on a side of the hole injection layer 401 away from the substrate 1.

For example, the hole transport layer 402 may be formed by spin coating, evaporation or inkjet printing.

A material of the hole transport layer 402 may include poly(9,9-dioctylfluorene-co-N-(4-butylphenyl)diphenylamine) (TFB) or Poly(N-vinylcarbazole) (PVK). In this step, a hole transport material may be formed on the hole injection layer 401 by a spin coating process or an evaporation process, and then the hole transport material is cured to obtain the hole transport layer 402.

Figure 18:
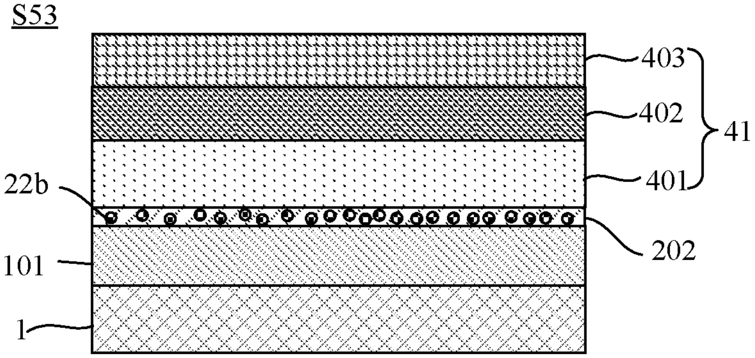

In S53, as shown in FIG. 18, an electron blocking layer 403 is formed on a side of the hole transport layer 402 away from the substrate 1.

For example, the electron blocking layer 403 may be formed by spin coating, evaporation or inkjet printing.

For example, a material of the electron blocking layer 403 may include 4,4'-Cyclohexylidenebis[N,N-bis(4-methylphenyl)aniline] or 4,4',4"-Tris(carbazol-9-yl)-triphenylamine, which is not limited here.

It can be understood that S51, S52 and S53 are steps of forming the first carrier transport layer 41.

Figure 19:
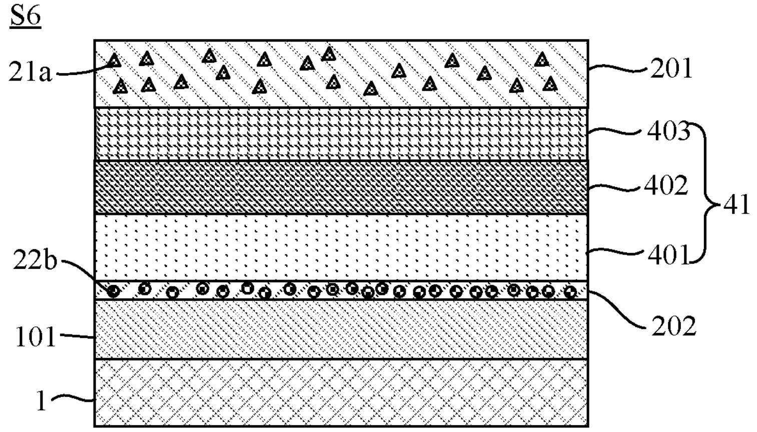

In S6, as shown in FIG. 19, the first light-emitting layer 201 is formed on a side of the electron blocking layer 403 away from the substrate 1. It can be understood that an operation method of S6 is the same as that of S32 in which the first light-emitting layer 201 is formed on the side of the second light-emitting layer 202 away from the substrate 1.

For example, the first light-emitting layer 201 may be a quantum dot light-emitting layer.

For example, the quantum dot light-emitting layer may be formed by spin coating, evaporation or inkjet printing. A material of the quantum dot light-emitting layer is as described above, and will not be repeated here.

Figure 20:
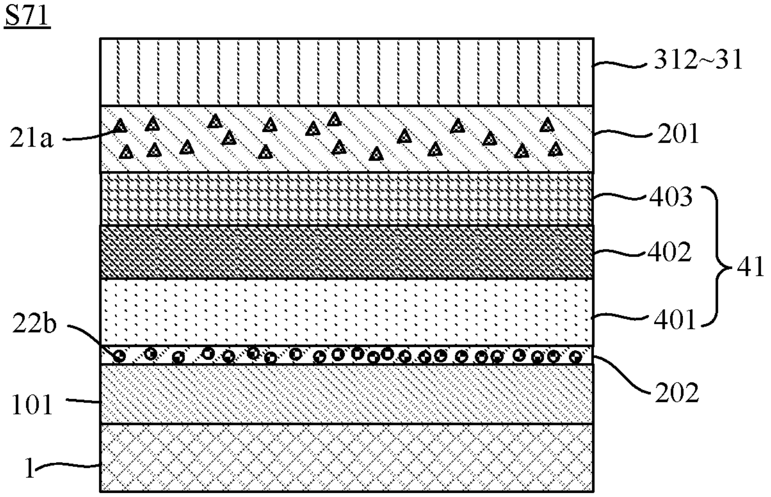

In S71, as shown in FIG. 20, a hole blocking layer 312 is formed on a side of the first light-emitting layer 201 away from the substrate 1.

For example, a material of the hole blocking layer 312 is as described above, and will not be repeated here.

Figure 21:
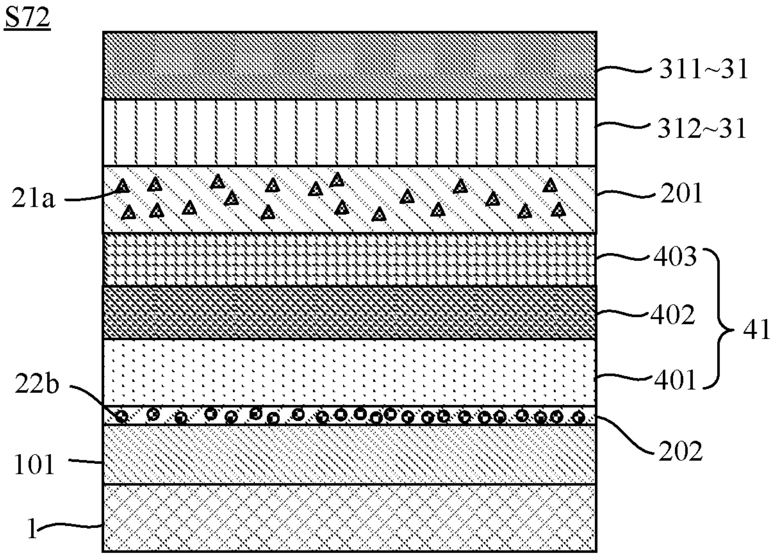

In S72, as shown in FIG. 21, an electron transport layer 311 is formed on a side of the hole blocking layer 312 away from the substrate 1.

For example, an electron transport material may be formed by spin coating, evaporation or inkjet printing, and then is cured to form the electron transport layer 311. The electron transport layer 311 may include a zinc oxide nanoparticle film or a zinc oxide sol-gel film.

In an example where the electron transport layer 311 is the zinc oxide nanoparticle film, zinc oxide nanoparticles with a concentration of 10 mg/mL to 30 mg/mL are spin-coated on the side of the hole blocking layer 312 away from the substrate 1, so as to form an electron transport material layer. The rotation speed of the spin coater may be set to be in a range of 500 rpm to 2500 rpm, inclusive. Then, the electron transport material layer is cured at 25° C. to 120° C. to obtain the electron transport layer 311. The zinc oxide nanoparticles may be ion-doped zinc oxide nanoparticles, such as magnesium, indium, aluminum, gallium, and magnesium oxide nanoparticles.

In an example where the electron transport layer 311 is the zinc oxide sol-gel film, 2 g of zinc acetate is added to a mixed solvent containing 10 mL of ethanolamine and n-butanol to form a zinc acetate solution. The zinc acetate solution is spin-coated on the side of the hole barrier layer 312 away from the substrate 1 to form the electron transport material layer. The rotation speed of the spin coater may be set to be in a range of 1000 rpm to 4000 rpm, inclusive. Then, the electron transport material layer is cured to obtain the electron transport layer 311 at 180° C. to 250° C.

Figure 22:
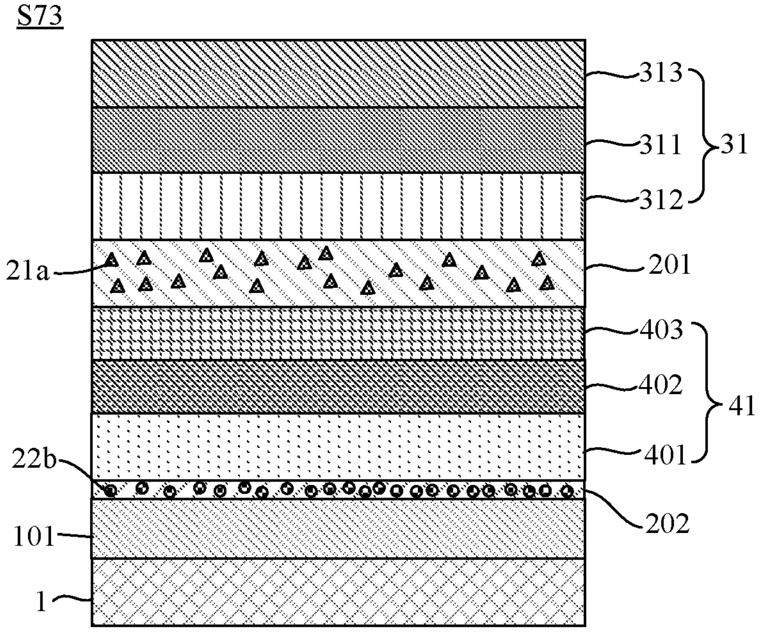

In S73, as shown in FIG. 22, an electron injection layer 313 is formed on a side of the electron transport layer 311 away from the substrate 1.

It can be understood that S71, S72 and S73 are steps of forming the second carrier transport layer 31.

In S8, as shown in FIG. 4, the second electrode 102 is formed on a side of the electron injection layer 313 away from the substrate 1.

For example, the second electrode 102 may be a cathode, and a cathode layer may be formed by evaporation or sputtering.

For example, a material of the cathode layer may include metal such as aluminum copper or silver, or may include indium tin oxide or indium zinc oxide.

For example, the cathode layer includes electrodes arranged as a whole layer.

In S9, encapsulation is performed.

For example, under an excitation of ultraviolet light, the light-emitting device may be encapsulated by using ultraviolet curing adhesive, and an encapsulation cover plate is covered on the light-emitting device. The cover plate is used for protecting the light-emitting device.

Figure 23:
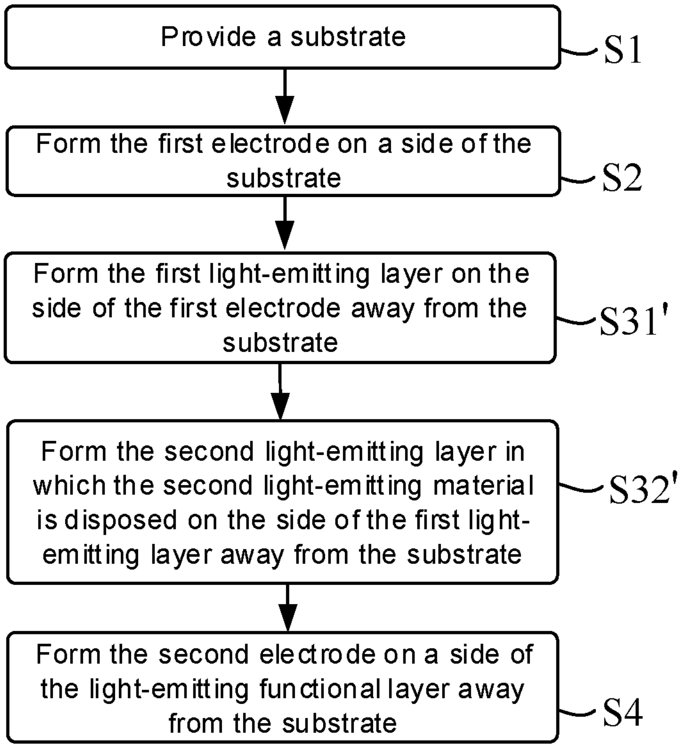
FIG. 23 is yet another flow diagram of a manufacturing method of a light-emitting device, in accordance with some embodiments of the present disclosure.

In some embodiments, as shown in FIG. 23, the step of forming the light-emitting functional layer 2 on the side of the first electrode 101 away from the substrate 1 includes S31' and S32'.

In S31', the first light-emitting layer 201 is formed on the side of the first electrode 101 away from the substrate.

In S32', the second light-emitting layer 202 in which the second light-emitting material is disposed is formed on the side of the first light-emitting layer 201 away from the substrate 1.

Figure 24:
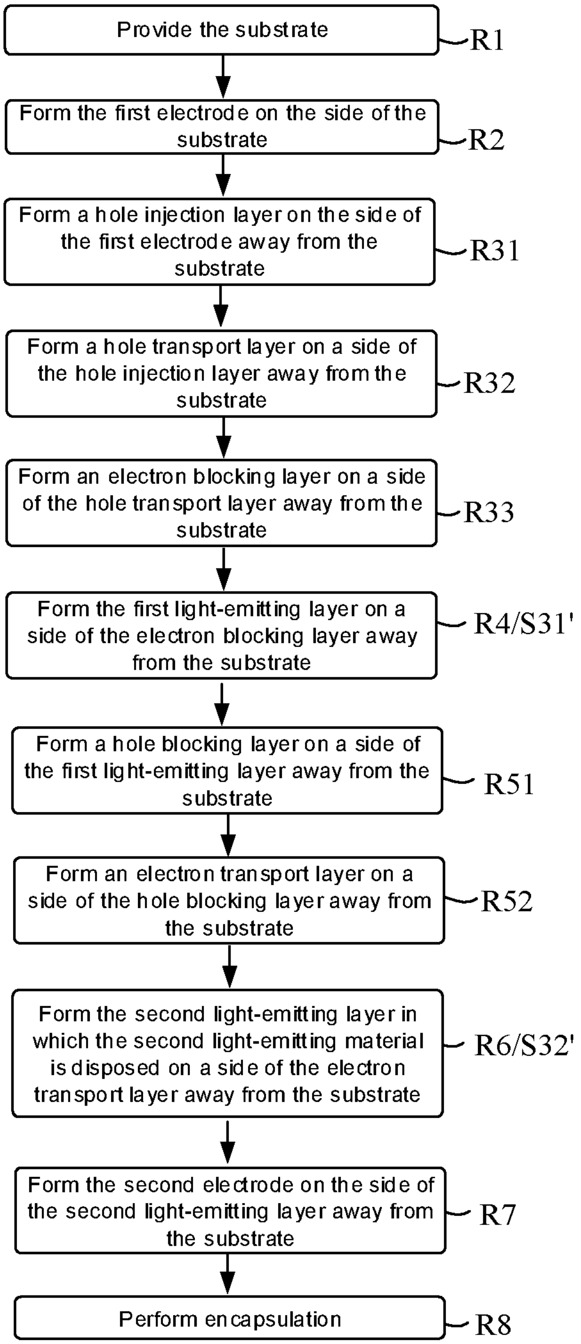
FIG. 24 is another step diagram of manufacturing method of a light-emitting device, in accordance with some embodiments of the present disclosure.

In some examples, as shown in FIG. 24, specific steps of the manufacturing method of the light-emitting device 10 include following R1 to R8.

In R1, the substrate 1 is provided.

In R2, as shown in FIG. 14, the first electrode 101 is formed on the side of the substrate 1.

Figure 25:
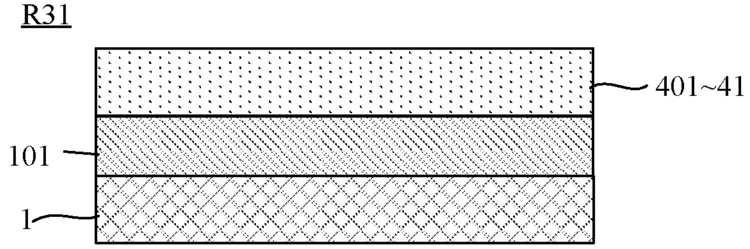
FIGS. 25 to 32 are step diagrams of a manufacturing method of a light-emitting device, in accordance with some embodiments of the present disclosure.

In R31, as shown in FIG. 25, a hole injection layer 401 is formed on the side of the first electrode 101 away from the substrate 1.

Figure 26:
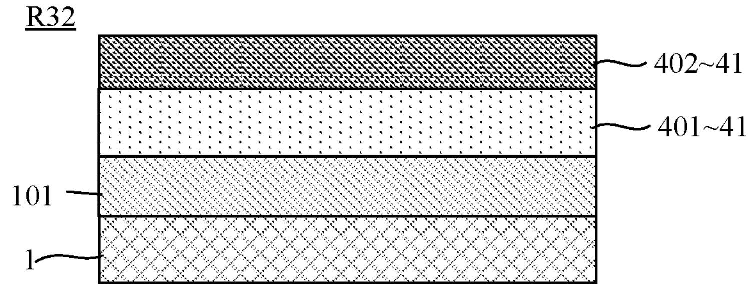

In R32, as shown in FIG. 26, a hole transport layer 402 is formed on a side of the hole injection layer 401 away from the substrate 1.

Figure 27:
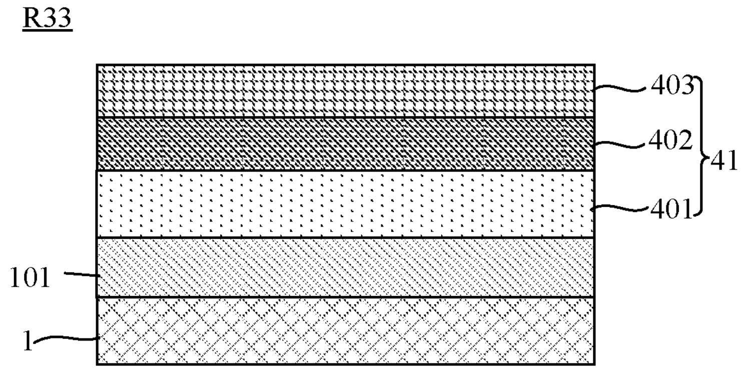

In R33, as shown in FIG. 27, an electron blocking layer 403 is formed on a side of the hole transport layer 402 away from the substrate 1.

It can be understood that R31, R32 and R33 are steps of forming the first carrier transport layer 41.

Figure 28:
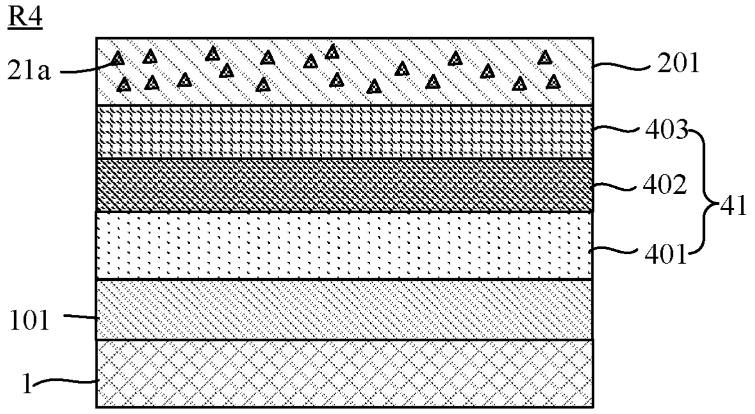

In R4, as shown in FIG. 28, the first light-emitting layer 201 is formed on a side of the electron blocking layer 403 away from the substrate 1. It can be understood that, an operation method of R4 is the same as that of S31' in which the first light-emitting layer 201 is formed on the side of the first electrode 101 away from the substrate.

Figure 29:
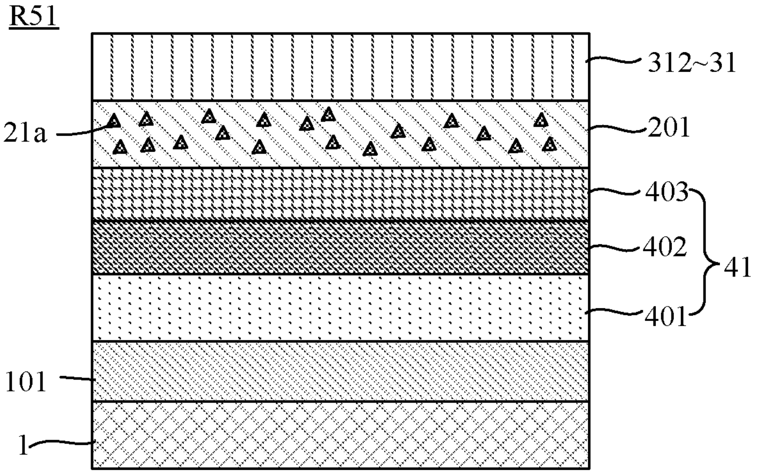

In R51, as shown in FIG. 29, a hole blocking layer 312 is formed on a side of the first light-emitting layer 201 away from the substrate 1.

Figure 30:
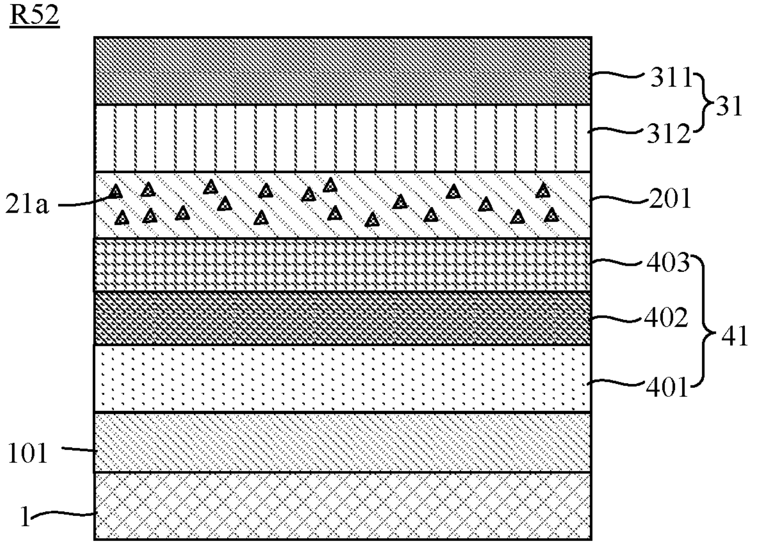

In R52, as shown in FIG. 30, an electron transport layer 311 is formed on a side of the hole blocking layer 312 away from the substrate 1.

It can be understood that R51 and R52 are steps of forming the second carrier transport layer 31.

Figure 31:
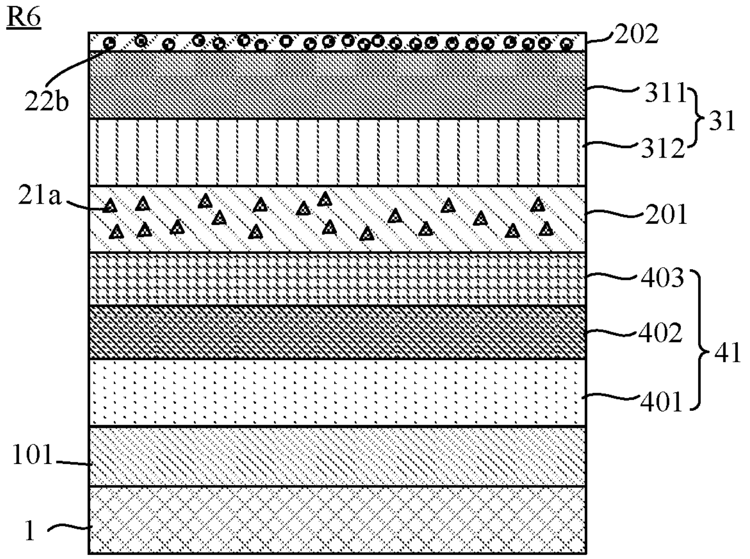

In R6, as shown in FIG. 31, the second light-emitting layer 202 in which the second light-emitting material is disposed is formed on a side of the electron transport layer 311 away from the substrate 1. It can be understood that an operation method of R6 is the same as that of S32' in which the second light-emitting layer 202 provided with the second light-emitting material therein is formed on the side of the first light-emitting layer 201 away from the substrate 1.

Figure 32:
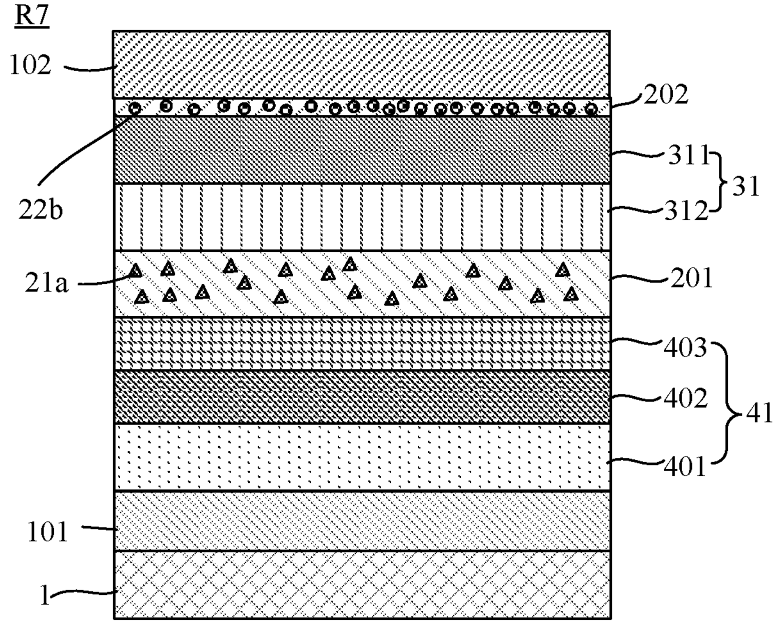

In R7, as shown in FIG. 32, the second electrode 102 is formed on the side of the second light-emitting layer 202 away from the substrate 1.

In R8, encapsulation is performed.

It will be noted that specific operations of R1 to R8 may refer to the above description, and will not be repeated here.

In some embodiments, as shown in FIG. 7, the step of forming the second light-emitting layer 202 on the side of the first electrode 101 away from the substrate 1 includes: forming a discontinuous second light-emitting layer 202 on the side of the first electrode 101 away from the substrate 1.

For example, when the second light-emitting layer 202 is formed, the perovskite quantum dot material is diluted firstly, and the diluted perovskite quantum dot material has a concentration in a range of 1 mg/mL to 10 mg/mL. Then, the perovskite (e.g., $CsPbBr_3$) quantum dot material is spin-coated by using a spin coater in a nitrogen atmosphere, and is annealed at 130° C. to 150° C. for ten minutes in the nitrogen atmosphere, so as to obtain a discontinuous film layer of the perovskite quantum dot material.

For example, a rotation speed of the spin coater may be in a range of 2000 rpm to 5000 rpm, inclusive. A concentration of the quantum dots is in a range of 1 mg/mL to 20 mg/mL, inclusive. A thickness of the formed second light-emitting layer 202 is in a range of 5 nm to 20 nm, inclusive.

For example, a manufacturing method of the perovskite quantum dot material may refer to the above description, and will not be repeated here.

It will be noted that a manufacturing method of other film layer in the light-emitting device 10 in which the second light-emitting layer 202 is the discontinuous film layer may refer to the above description, and will not be repeated here.

In some embodiments, as shown in FIG. 8, the light-emitting functional layer 2 includes the first light-emitting layer 201, and first carrier transport layer(s) 41 located between the first light-emitting layer 201 and the first electrode 101. A step of forming the first carrier transport layer 41 includes: mixing a first solution and a second solution including a carrier transport material, the first solution including the second light-emitting material 22*b*, and a doping concentration of the second light-emitting material 22*b* in the first carrier transport layer 41 being in a range of 1% to 10%, inclusive, coating the mixed solution, and curing the coated solution to obtain the first carrier transport layer 41. The first carrier transport layer 41 doped with the second light-emitting material 22*b* is a second light-emitting layer 202.

For example, referring to FIG. 8 again, the first carrier transport layer(s) 41 include a hole injection layer 401, and the second solution is a solution including a hole injection material. The first solution including the second light-emitting material 22*b* and the second solution including the hole injection material are mixed, and the mixed solution is coated to obtain the hole injection layer 401 doped with the second light-emitting material 22*b*. In this case, the hole injection layer 401 is the second light-emitting layer 202.

For example, the doping concentration of the second light-emitting material 22*b* in the first carrier transport layer 41 may be 1%, 3%, 5%, 7%, or 10%, which is not limited here.

Figure 33:
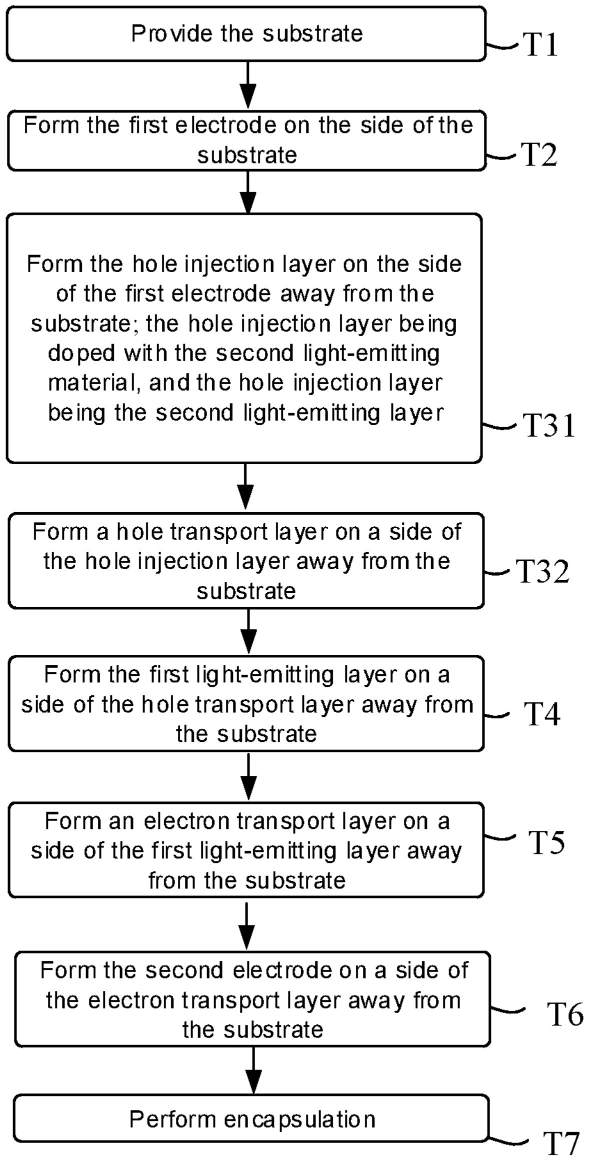
FIG. 33 is yet another step diagram of a manufacturing method of a light-emitting device, in accordance with some embodiments of the present disclosure.

In some examples, as shown in FIG. 33, specific steps of the manufacturing method of the light-emitting device 10 include following T1 to T7.

In T1, the substrate 1 is provided.

In T2, as shown in FIG. 14, the first electrode 101 is formed on the side of the substrate 1.

Figure 34:
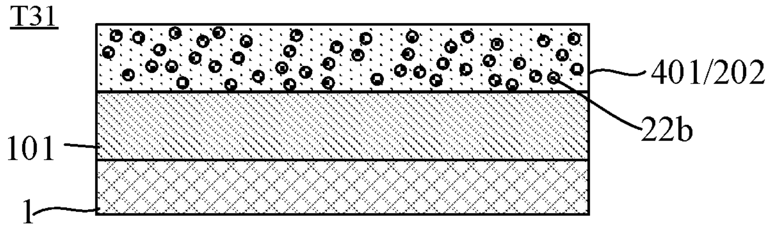
FIGS. 34 to 37 are step diagrams of a manufacturing method of a light-emitting device, in accordance with some embodiments of the present disclosure.

In T31, as shown in FIG. 34, the hole injection layer 401 is formed on the side of the first electrode 101 away from the substrate 1. The hole injection layer 401 is doped with the second light-emitting material 22*b*, and the hole injection layer 401 is the second light-emitting layer 202. The specific doping step is as described above, and will not be repeated here.

Figure 35:
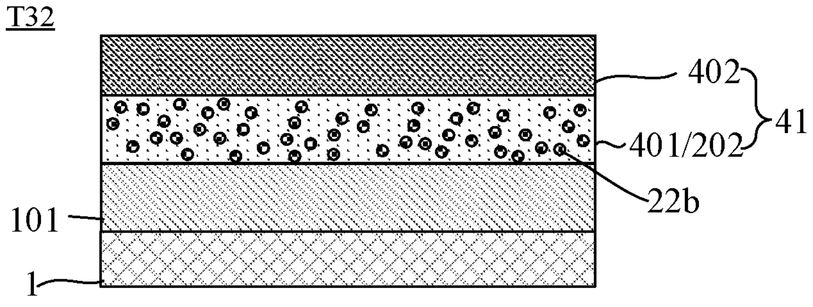

In T32, as shown in FIG. 35, a hole transport layer 402 is formed on a side of the hole injection layer 401 away from the substrate 1.

It can be understood that T31 and T32 each may be a step of forming the first carrier transport layer 41.

For example, the first carrier transport layer(s) 41 may further include an electron blocking layer 403. A step of forming the electron blocking layer 403 may refer to the above description, and will not be repeated here.

Figure 36:
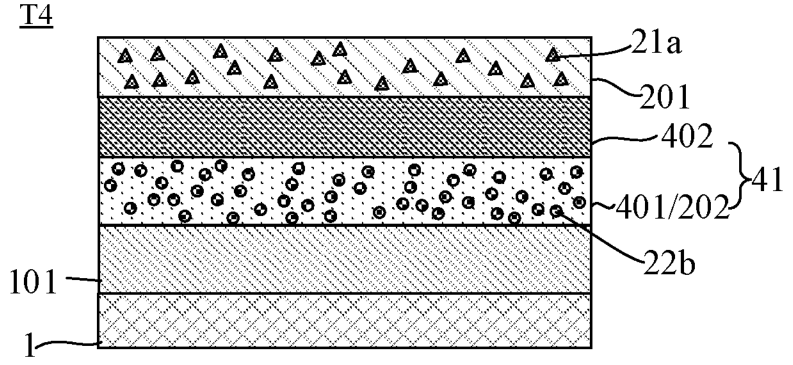

In T4, as shown in FIG. 36, the first light-emitting layer 201 is formed on a side of the hole transport layer 402 away from the substrate 1.

Figure 37:
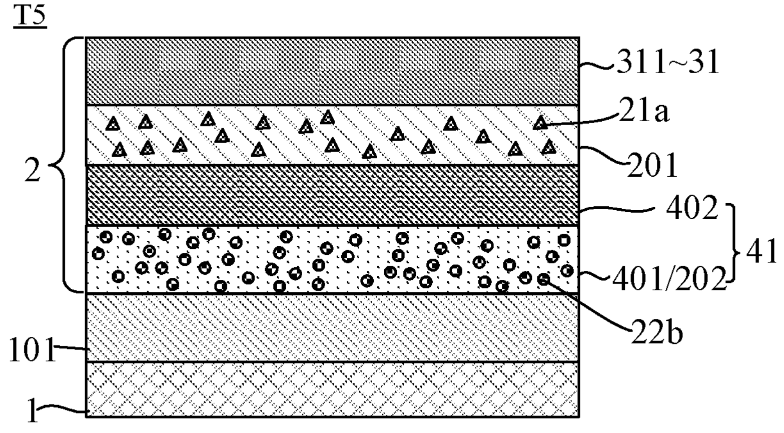

In T5, as shown in FIG. 37, an electron transport layer 311 is formed on a side of the first light-emitting layer 201 away from the substrate 1.

It can be understood that T5 is a step of forming the second carrier transport layer 31.

For example, the second carrier transport layer(s) 31 may further include a hole blocking layer 312 and an electron injection layer 313. Steps of forming the hole blocking layer 312 and the electron injection layer 313 may refer to the above description, and will not be repeated here.

In T6, as shown in FIG. 8, the second electrode 102 is formed on a side of the electron transport layer 311 away from the substrate 1.

In T7, encapsulation is performed.

It will be noted that specific operation steps of T1, T2 and T32 to T7 may refer to the above description, and will not be repeated here.

In a case where the light-emitting device 10 has an upright structure, the first electrode 101 is disposed on the substrate 1 of the light-emitting device, and the second electrode 102 is disposed on the side of the first electrode 101 away from the substrate 1. In a case where the light-emitting device 10 has an inverted structure, the second electrode 102 is disposed on the substrate 1 of the light-emitting device 10, and the first electrode 101 is disposed on a side of the second electrode 102 away from the substrate 1.

Beneficial effects of the above manufacturing method of the light-emitting device are the same as those of the light-emitting device provided in the first aspect of the present disclosure, and will not be repeated here.

Figure 38:
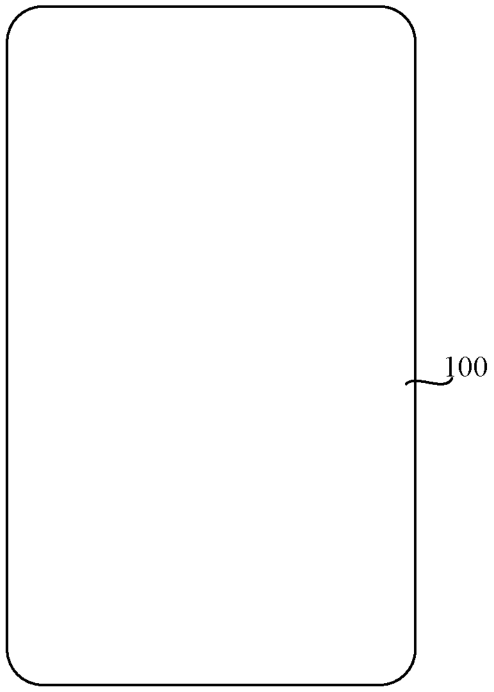
FIG. 38 is a structural diagram of a display substrate, in accordance with some embodiments of the present disclosure.

A third aspect of the present disclosure provides a display substrate 100. As shown in FIG. 38, the display substrate 100 includes the above light-emitting devices 10.

The display substrate 100 may be, for example, an organic light-emitting diode (OLED) display substrate, a micro organic light-emitting diode (Micro OLED) display substrate, a quantum dot light-emitting diode (QLED) display substrate, a mini light-emitting diode (Mini LED) display substrate, or a micro light-emitting diode (Micro LED) display substrate.

Beneficial effects of the display substrate 100 are the same as those of the light-emitting device provided in the first aspect of the present disclosure, and will not be repeated here.

The foregoing descriptions are only specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising:

a first electrode and a second electrode arranged opposite to each other; and a light-emitting functional layer located between the first electrode and the second electrode; wherein the light-emitting functional layer includes a first light-emitting layer, and the first light-emitting layer includes a first light-emitting material; the first light-emitting material is configured to emit light in response to a control of an electrical signal on the first electrode and an electrical signal on the second electrode; and the light-emitting functional layer further includes a second light-emitting material; a difference between a Stokes shift of the first light-emitting material and a Stokes shift of the second light-emitting material is in a range of 10 nm to 50 nm, inclusive.

2. The light-emitting device according to claim 1, wherein the second light-emitting material is configured to absorb light that does not exit from the light-emitting device in first light emitted from the first light-emitting material, and to emit second light; wherein a peak position of the first light emitted from the first light-emitting material is a first peak position, and a peak position of the second light emitted from the second light-emitting material is a second peak position; a difference between a peak wavelength at the first peak position and a peak wavelength at the second peak position is in a range of 0 nm to 10 nm, inclusive.

3. The light-emitting device according to claim 1, wherein a mass ratio of the second light-emitting material to the first light-emitting material is in a range of 0.1% to 10%, inclusive.

4. The light-emitting device according to claim 1, wherein the light-emitting functional layer further includes a first carrier transport layer located between the first light-emitting layer and the first electrode, and a second carrier transport layer located between the first light-emitting layer and the second electrode; and the second light-emitting material is located between the first carrier transport layer and the first electrode, and/or the second light-emitting material is located between the second carrier transport layer and the second electrode; wherein the second light-emitting material is disposed is a second light-emitting layer.

5. The light-emitting device according to claim 4, wherein the first carrier transport layer includes at least one of a hole injection layer, a hole transport layer and an electron blocking layer; and the second carrier transport layer includes at least one of an electron injection layer, an electron transport layer and a hole blocking layer.

6. The light-emitting device according to claim 4, wherein the second light-emitting layer is a discontinuous film layer.

7. The light-emitting device according to claim 4, wherein a film thickness of the second light-emitting layer is in a range of 5 nm to 20 nm, inclusive.

8. The light-emitting device claim 1, wherein the light-emitting functional layer further includes at least one first carrier transport layer located between the first light-emitting layer and the first electrode and doped with the second light-emitting material; wherein the at least one first carrier transport layer doped with the second light-emitting material is a second light-emitting layer.

9. The light-emitting device according to claim 8, wherein the at least one first carrier transport layer includes a hole injection layer, and the second light-emitting material is located in the hole injection layer.

10. The light-emitting device according to claim 8, wherein a doping concentration of the second light-emitting material in the at least one first carrier transport layer is in a range of 1% to 10%, inclusive.

11. The light-emitting device according to claim 1, wherein the second light-emitting material is a perovskite quantum dot material.

12. The light-emitting device according to claim 11, wherein a particle size of the perovskite quantum dot material is in a range of 10 nm to 110 nm, inclusive.

13. The light-emitting device according to claim 11, wherein a chemical formula of the perovskite quantum dot material is $CsPbX_3$, wherein X represents one of halogens.

14. The light-emitting device according to claim 1, wherein the second light-emitting material is capable of emitting light with one of at least three colors.

15. The light-emitting device according to claim 1, wherein the first light-emitting layer is a quantum dot light-emitting layer; and the first light-emitting material is different from the second light-emitting material.

16. A manufacturing method of a light-emitting device, comprising:

forming a first electrode, a second electrode and a light-emitting functional layer; wherein the first electrode and the second electrode are arranged opposite to each other, and the light-emitting functional layer is located between the first electrode and the second electrode; wherein the light-emitting functional layer includes a first light-emitting layer, and the first light-emitting layer includes a first light-emitting material; the first light-emitting material is configured to emit light in response to a control of an electrical signal on the first electrode and an electrical signal on the second electrode;

the light-emitting functional layer further includes a second light-emitting material; the second light-emitting material is configured to absorb light that does not exit from the light-emitting device in the light emitted from the first light-emitting material, and to emit light; and a difference between a Stokes shift of the first light-emitting material and a Stokes shift of the second light-emitting material is in a range of 10 nm to 50 nm, inclusive.

17. The manufacturing method of the light-emitting device according to claim 16, wherein forming the first electrode, the second electrode and the light-emitting functional layer, includes:

providing a substrate;

forming the first electrode on a side of the substrate;

forming the light-emitting functional layer on a side of the first electrode that is facing away from the substrate; and forming the second electrode on a side of the light-emitting functional layer that is facing away from the substrate; wherein forming the light-emitting functional layer on the side of the first electrode that is facing away from the substrate, includes:

forming a second light-emitting layer in which the second light-emitting material is disposed on the side of the first electrode that is facing away from the substrate; and forming the first light-emitting layer on a side of the second light-emitting layer that is facing away from the substrate;

or forming the light-emitting functional layer on the side of the first electrode that is facing away from the substrate, includes:

forming the first light-emitting layer on the side of the first electrode that is facing away from the substrate; and forming the second light-emitting layer in which the second light-emitting material is disposed on a side of the first light-emitting layer that is facing away from the substrate.

18. The manufacturing method of the light-emitting device according to claim 17, wherein forming the second light-emitting layer on the side of the first electrode that is facing away from the substrate, includes:

forming the second light-emitting layer that is discontinuous on the side of the first electrode that is facing away from the substrate.

19. The manufacturing method of the light-emitting device according to claim 16, wherein the light-emitting functional layer further includes a first carrier transport layer located between the first light-emitting layer and the first electrode; and forming the first carrier transport layer, includes:

mixing a first solution and a second solution including a carrier transport material; wherein the first solution includes the second light-emitting material, and a doping concentration of the second light-emitting material in the first carrier transport layer is in a range of 1% to 10%, inclusive; and coating the mixed solution, and curing the coated solution to obtain the first carrier transport layer; wherein the first carrier transport layer doped with the second light-emitting material is a second light-emitting layer.

20. A display substrate, comprising light-emitting devices according to claim 1.

* * * * *